(12) United States Patent
Park et al.

(10) Patent No.: US 12,507,483 B2
(45) Date of Patent: Dec. 23, 2025

(54) SEMICONDUCTOR DEVICE AND METHOD FOR MANUFACTURING THE SAME

(71) Applicant: Samsung Electronics Co., Ltd., Suwon-si (KR)

(72) Inventors: Sung Il Park, Suwon-si (KR); Jae Hyun Park, Hwaseong-si (KR); Do Young Choi, Hwaseong-si (KR); Yoshinao Harada, Hwaseong-si (KR); Dae Won Ha, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 811 days.

(21) Appl. No.: 17/693,883

(22) Filed: Mar. 14, 2022

(65) Prior Publication Data
US 2022/0415931 A1 Dec. 29, 2022

(30) Foreign Application Priority Data
Jun. 24, 2021 (KR) .................. 10-2021-0082400

(51) Int. Cl.
*H10D 87/00* (2025.01)
*H10D 84/03* (2025.01)

(52) U.S. Cl.
CPC .......... *H10D 87/00* (2025.01); *H10D 84/038* (2025.01)

(58) Field of Classification Search
CPC .. H10D 87/00; H10D 84/038; H10D 84/0188; H10D 84/201; H10D 62/052; H10D 64/519; H10D 84/135; H10D 30/721; H10D 64/117; H10D 10/881; H10D 1/694; H10D 84/144; H10H 20/826;
(Continued)

(56) References Cited

U.S. PATENT DOCUMENTS 10,714,391 B2   7/2020   Smith et al.
10,748,994 B2   8/2020   Reznicek et al.
(Continued)

FOREIGN PATENT DOCUMENTS

KR   20180102273 A   9/2018
KR   20190031855 A   3/2019
(Continued)

*Primary Examiner* — Jeff W Natalini
*Assistant Examiner* — Rose Keagy
(74) *Attorney, Agent, or Firm* — Wolf, Greenfield & Sacks, P.C.

(57) ABSTRACT

A semiconductor device comprises a substrate, a first active pattern on the substrate and extending in a first direction, a second active pattern extending in the first direction spaced apart from the substrate, a gate electrode extending in a second direction surrounding the first and second active patterns, and a high dielectric film between the first and second active patterns and the gate electrode. The gate electrode includes first and second work function adjusting films surrounding the high dielectric film on the first and second active patterns, and a filling conductive film surrounding the first and second work function adjusting films. The first and second work function adjusting films include first and second work function conductive films, each of which includes a first metal film. A thickness of the first metal film of the first work function conductive film is greater than that of the second work function conductive film.

20 Claims, 38 Drawing Sheets

(58) Field of Classification Search
CPC .. H10H 29/011; A23B 2/783; A61K 40/4218; A61K 40/4277; C01G 53/82; H02K 15/027; H10F 19/908; H10F 99/00; B82Y 10/00; F27D 17/20; H01L 21/28088; A45C 11/003; B65D 83/166
See application file for complete search history.

(56) References Cited

U.S. PATENT DOCUMENTS

| | | |
|---|---|---|
| 10,833,078 B2 | 11/2020 | Smith et al. |
| 10,916,552 B2 | 2/2021 | Reznicek et al. |
| 10,923,602 B2 | 2/2021 | Kim et al. |
| 2006/0131652 A1* | 6/2006 | Li .................. H10D 84/0181 |
| | | 257/E21.639 |
| 2018/0315667 A1* | 11/2018 | Kwon .................. H10D 84/85 |
| 2019/0131395 A1* | 5/2019 | Lee .................. H10D 64/017 |
| 2019/0172828 A1* | 6/2019 | Smith .................. H10D 86/60 |
| 2019/0326286 A1 | 10/2019 | Xie et al. |
| 2020/0098756 A1 | 3/2020 | Lilak et al. |
| 2020/0294866 A1* | 9/2020 | Cheng .................. H10D 30/6757 |
| 2021/0005604 A1 | 1/2021 | Ge et al. |
| 2021/0265348 A1* | 8/2021 | Xie .................. H10D 88/01 |
| 2021/0398978 A1* | 12/2021 | Kim .................. H10D 84/85 |

FOREIGN PATENT DOCUMENTS

| | | |
|---|---|---|
| KR | 20210029641 A | 3/2021 |
| KR | 20210053163 A | 5/2021 |

\* cited by examiner

SEMICONDUCTOR DEVICE AND METHOD FOR MANUFACTURING THE SAME

CROSS-REFERENCE TO RELATED APPLICATION

This application claims priority from Korean Patent Application No. 10-2021-0082400 filed on Jun. 24, 2021, in the Korean Intellectual Property Office, and all the benefits accruing therefrom under 35 U.S.C. 119, the contents of which in its entirety are herein incorporated by reference.

FIELD

The present disclosure relates to a semiconductor device and a method for manufacturing the same.

BACKGROUND

Scaling schemes for increasing a density of an integrated circuit device may include multi-gate transistors, in which a silicon body in a shape of a fin or a nanowire is formed on a substrate, and a gate is formed on a surface of the silicon body.

Because such multi-gate transistors use a three-dimensional channel, it may be easier to scale the devices. Further, current control capability of multi-gate transistors may be improved without increasing a gate length of the multi-gate transistor. In addition, multi-gate transistors may effectively suppress SCE (short channel effect) in which potential of a channel area is affected by drain voltage.

SUMMARY

A technical purpose of the present disclosure is to provide a semiconductor device including a multi-gate transistor having multiple threshold voltages and thus having improved performance.

Another technical purpose of the present disclosure is to provide a method for manufacturing a semiconductor device including a multi-gate transistor having multiple threshold voltages and thus having improved performance.

According to some aspects of the present inventive concept, there is provided a semiconductor device comprising a substrate, a first active pattern on the substrate and extending in a first direction, a second active pattern spaced apart from the substrate by a larger spacing than a spacing by which the first active pattern is spaced apart from the substrate, wherein the second active pattern extends in the first direction, a gate electrode on the substrate, extending in a second direction intersecting the first direction, and surrounding the first active pattern and the second active pattern, and a high dielectric film between the first active pattern and the gate electrode and between the second active pattern and the gate electrode, wherein the gate electrode includes a first work function adjusting film surrounding the high dielectric film on the first active pattern, a second work function adjusting film surrounding the high dielectric film on the second active pattern, and a filling conductive film surrounding the first work function adjusting film and the second work function adjusting film, wherein the first work function adjusting film includes a first work function insulating film including a first metal oxide film, and a first work function conductive film including p metal films, where p is a natural number, wherein the second work function adjusting film includes a second work function conductive film including q metal films, where q is a natural number smaller than or equal to p.

According to some aspects of the present inventive concept, there is provided a semiconductor device comprising a substrate, a first active pattern on the substrate and extending in a first direction, a second active pattern spaced apart from the substrate by a larger spacing than a spacing by which the first active pattern is spaced apart from the substrate, wherein the second active pattern extends in the first direction, a gate electrode on the substrate, extending in a second direction intersecting the first direction, and surrounding the first active pattern and the second active pattern, and a high dielectric film between the first active pattern and the gate electrode and between the second active pattern and the gate electrode, wherein the gate electrode includes a first work function adjusting film surrounding the high dielectric film on the first active pattern, a second work function adjusting film surrounding the high dielectric film on the second active pattern, and a filling conductive film surrounding the first work function adjusting film and the second work function adjusting film, wherein the first work function adjusting film includes m metal oxide films, wherein m is a natural number, wherein the m metal oxide films include a first metal oxide film, wherein the second work function adjusting film includes n metal oxide films, wherein n is a natural number smaller than m, wherein the n metal oxide films include the first metal oxide film.

According to some aspects of the present inventive concept, there is provided a semiconductor device comprising a substrate, a first active pattern on the substrate and extending in a first direction, a second active pattern spaced apart from the substrate by a larger spacing than a spacing by which the first active pattern is spaced apart from the substrate, wherein the second active pattern extends in the first direction, a gate electrode on the substrate, extending in a second direction intersecting the first direction, and surrounding the first active pattern and the second active pattern, and a high dielectric film between the first active pattern and the gate electrode and between the second active pattern and the gate electrode, wherein the gate electrode includes a first work function adjusting film surrounding the high dielectric film on the first active pattern, a second work function adjusting film surrounding the high dielectric film on the second active pattern, and a filling conductive film surrounding the first work function adjusting film and the second work function adjusting film, wherein the first work function adjusting film includes a first work function insulating film including a first metal oxide film, and a first work function conductive film including a first metal film, wherein the second work function adjusting film includes a second work function conductive film including the first metal film, wherein a thickness of the first metal film of the first work function conductive film is greater than a thickness of the first metal film of the second work function conductive film.

The present disclosure is not limited to the above-mentioned purposes. Other purposes and advantages according to the present disclosure that are not mentioned may be understood based on following description, and may be more clearly understood based on embodiments according to the present disclosure. Further, it will be understood that the purposes and advantages according to the present disclosure may be realized in accordance with the claims and any combinations thereof.

BRIEF DESCRIPTION OF DRAWINGS

The above and other aspects and features of the present disclosure will become more apparent by describing in detail example embodiments thereof with reference to the attached drawings, in which.

DETAILED DESCRIPTION OF EMBODIMENTS

Figure 1:
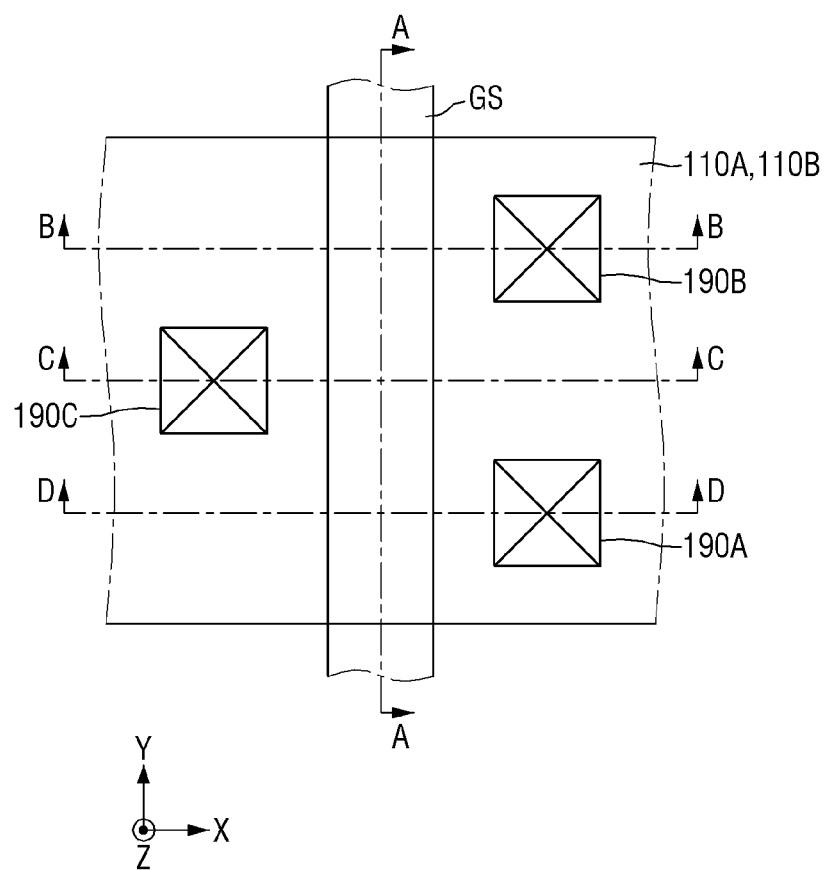
FIG. 1 is an example layout diagram for illustrating a semiconductor device according to some embodiments.

For simplicity and clarity of illustration, elements in the drawings are not necessarily drawn to scale. The same reference numbers in different drawings represent the same or similar elements, and as such perform similar functionality. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for illustrating embodiments of the present disclosure are by way of example, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter. That is, when elements or layers are referred to as being "directly" on, beneath, under, connected, between, etc., one another, no intervening elements or layers are present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain embodiment may be implemented differently, a function or operation specified in a specific block may occur in a sequence different from that specified in a flowchart. For example, two consecutive blocks may be actually executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship. Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, when the device in the drawings may be turned over, elements described as "below" or "beneath" or "under" other elements or features would then be oriented "above" the other elements or features. Thus, the example terms "below" and "under" may encompass both an orientation of above and below. The device may be otherwise oriented, for example, rotated 90 degrees or at other orientations, and the spatially relative descriptors used herein should be interpreted accordingly.

Terms as used herein "first direction X", "second direction Y" and "third direction Z" should not be interpreted only to have a geometric relationship in which the first direction, the second direction, and the third direction are perpendicular to each other. The "first direction X", "second direction Y" and "third direction Z" may be interpreted to have a broader direction within a range in which components herein may work functionally.

Hereinafter, semiconductor devices according to embodiments will be described with reference to FIGS. 1 to 18 and Tables 1 to 5.

Figure 2A:
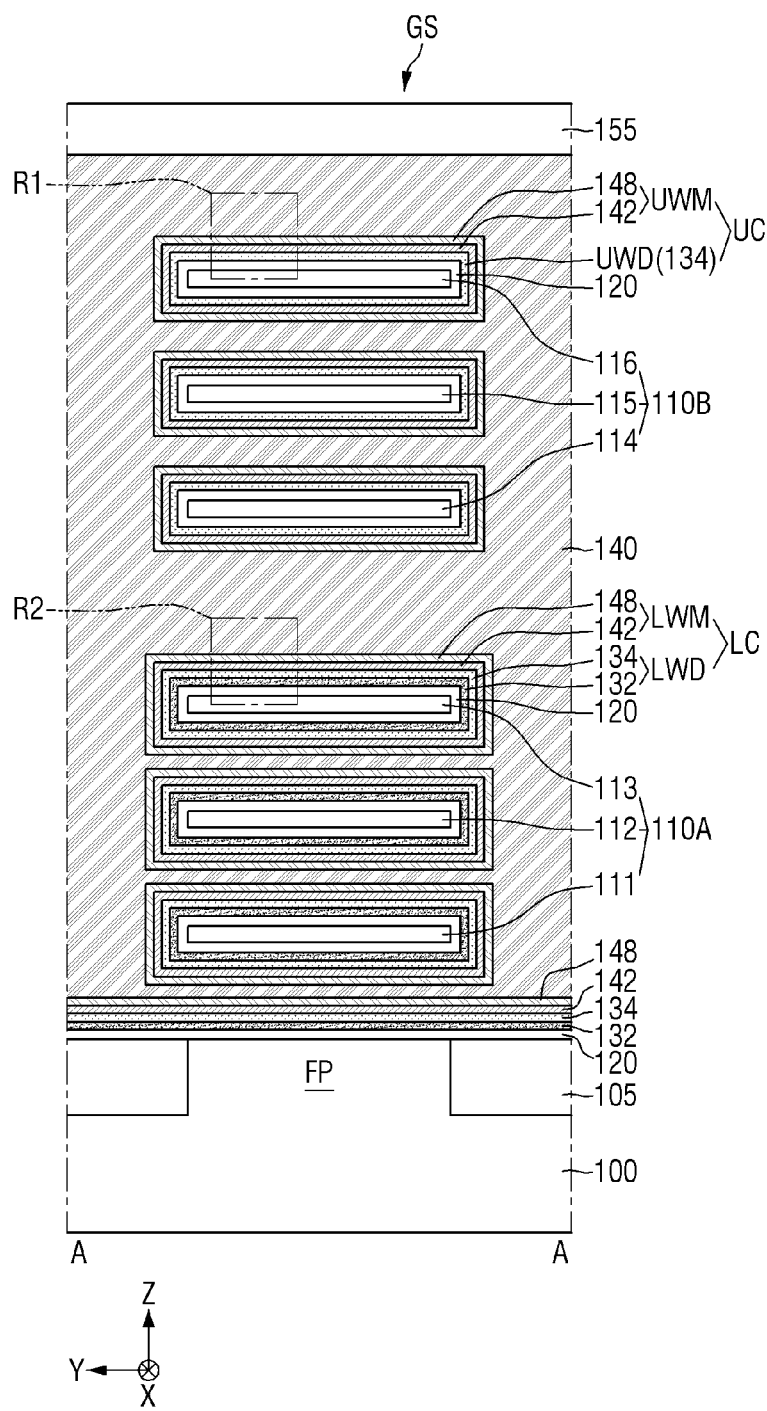
FIG. 2A is a cross-sectional view taken along a line A-A of FIG. 1.
Figure 2B:
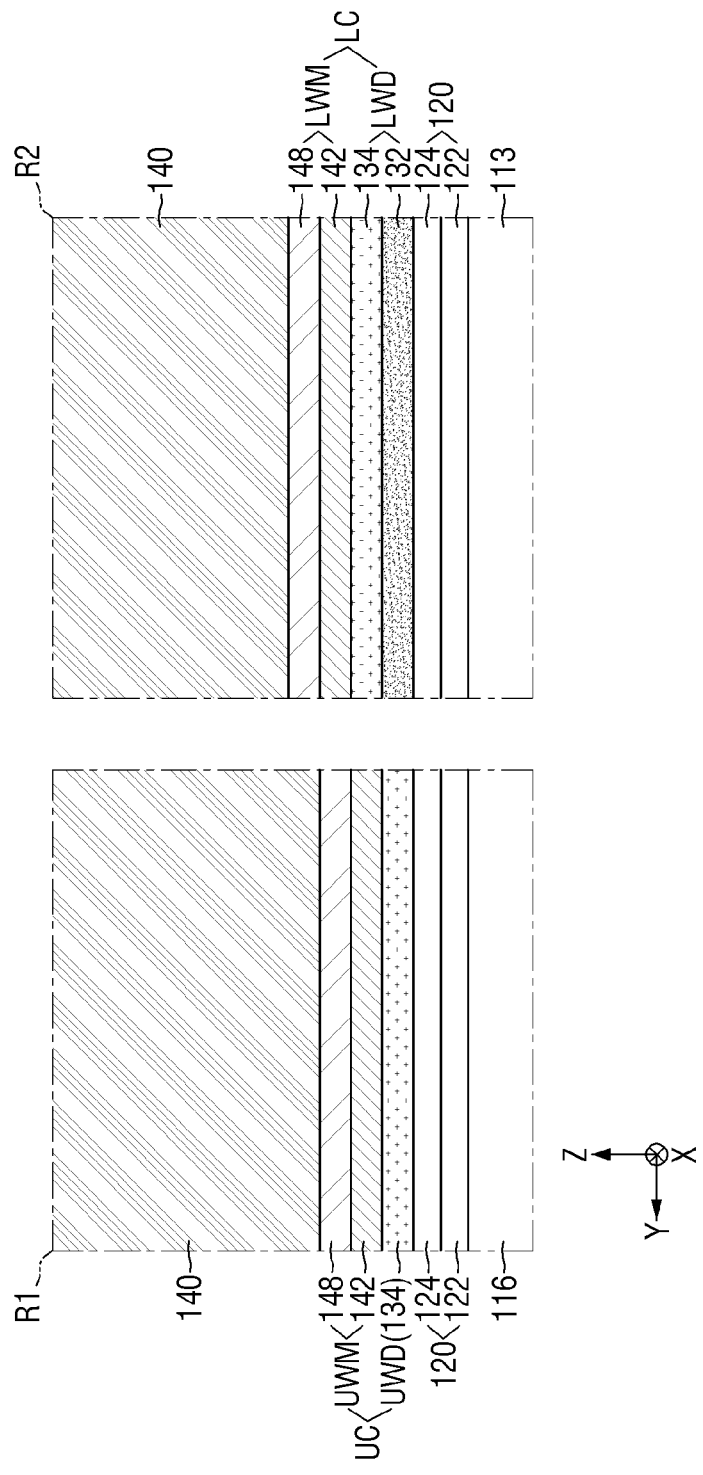
FIG. 2B is an enlarged view for illustrating a R1 area and a R2 area of FIG. 2A.
Figure 3:
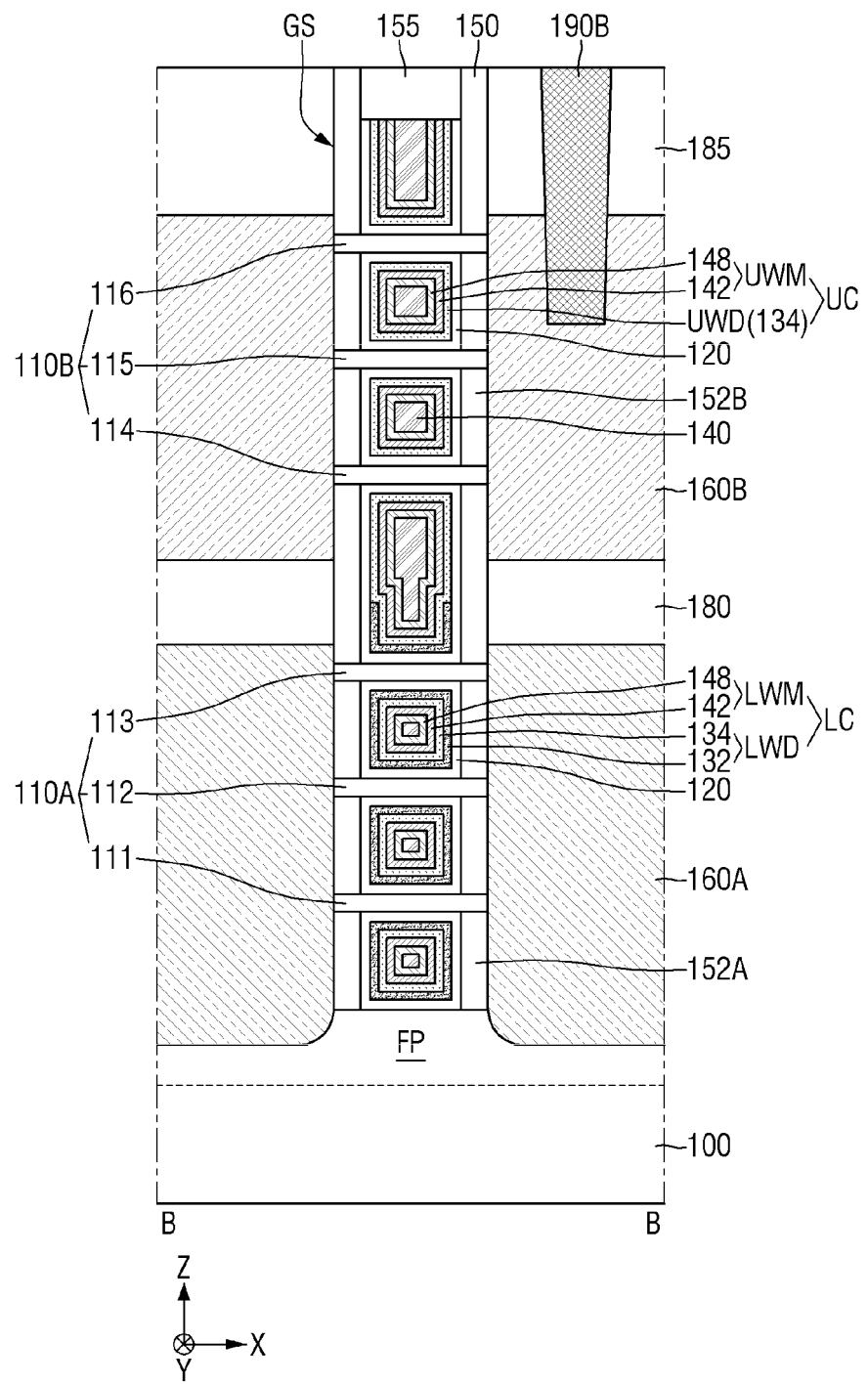
FIG. 3 is a cross-sectional view taken along a line B-B of FIG. 1.
Figure 4:
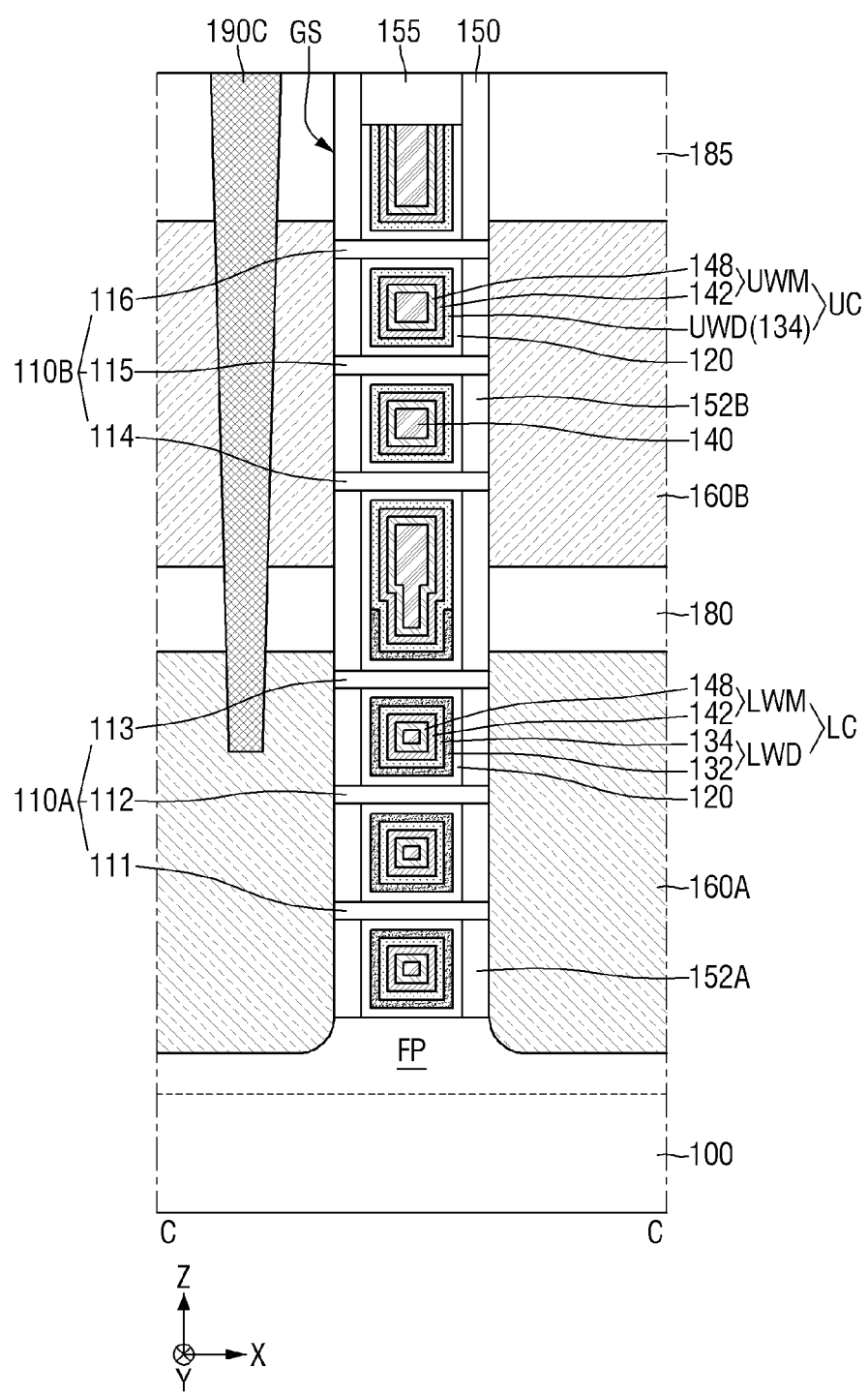
FIG. 4 is a cross-sectional view taken along a line C-C in FIG. 1.
Figure 5:
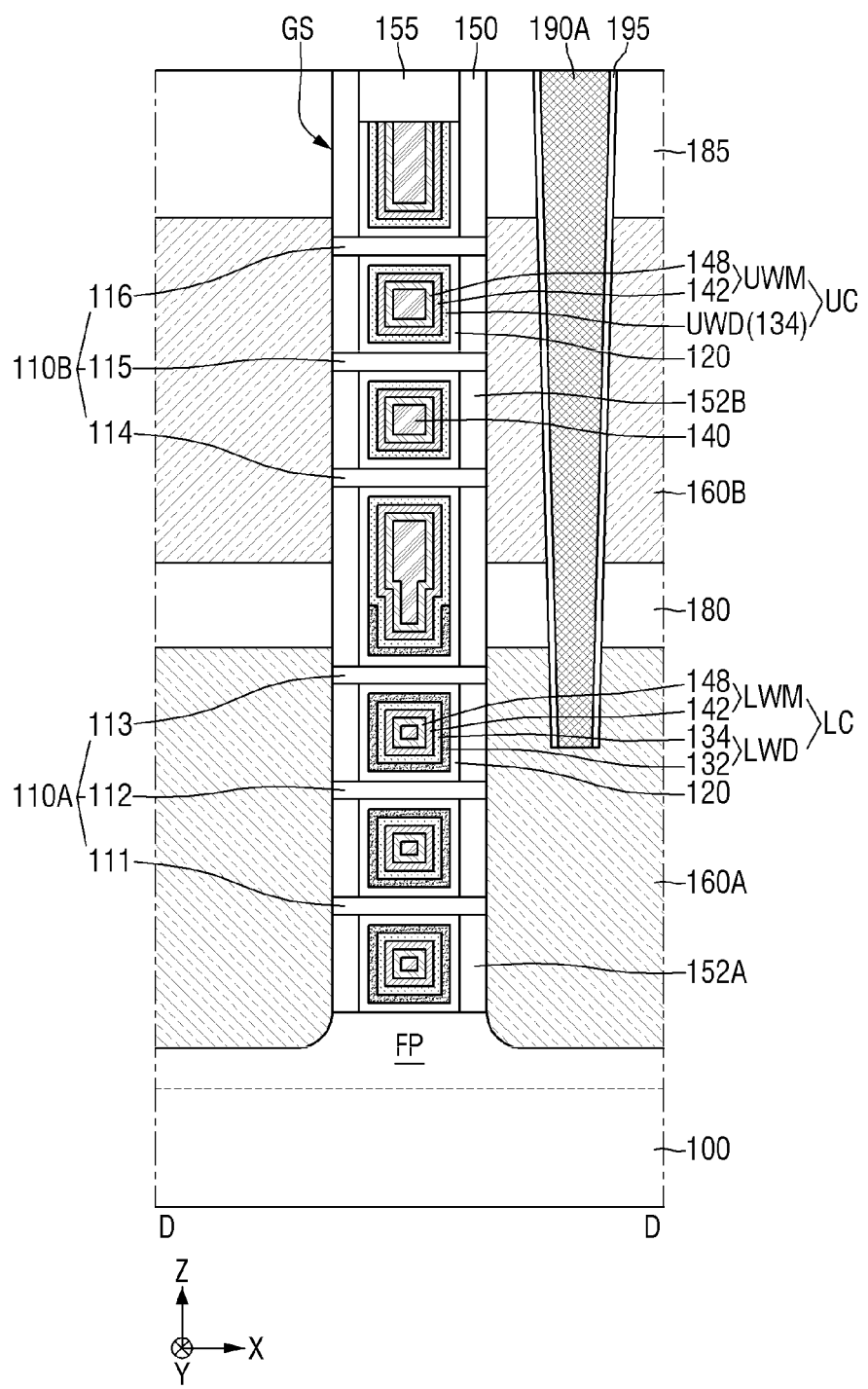
FIG. 5 is a cross-sectional view taken along a line D-D of FIG. 1.

FIG. 1 is an example layout diagram for illustrating a semiconductor device according to some embodiments. FIG. 2A is a cross-sectional view taken along a line A-A of FIG. 1. FIG. 2B is an enlarged view for illustrating a R1 area and a R2 area of FIG. 2A. FIG. 3 is a cross-sectional view taken along a line B-B of FIG. 1. FIG. 4 is a cross-sectional view taken along a line C-C in FIG. 1. FIG. 5 is a cross-sectional view taken along a line D-D of FIG. 1.

Referring to FIG. 1 to FIG. 5, a semiconductor device according to some embodiments includes a substrate 100, a field insulating film 105, a first active pattern 110A, a second active pattern 110B, a gate structure GS, a first source/drain area 160A, a second source/drain area 160B, a first separating insulating film 180, an interlayer insulating film 185, a first source/drain contact 190A, a second source/drain contact 190B, and a third source/drain contact 190C.

The substrate 100 may be made of bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide or gallium antimonide, but may not limited thereto. Alternatively, the substrate 100 may include a base substrate and an epitaxial layer formed on the base substrate. For convenience of description, an example in which the substrate 100 is embodied as the silicon substrate is described below.

The first active pattern 110A and the second active pattern 110B may be sequentially stacked on the substrate 100. The first active pattern 110A may be formed on the substrate 100. The second active pattern 110B may be spaced apart from the first active pattern 110A and may be disposed above the first active pattern 110A. That is, the second active pattern 110B may be spaced apart from the substrate 100 by a larger spacing than a spacing by which the first active pattern 110A may be spaced from the substrate 100. Each of the first active pattern 110A and the second active pattern 110B may extend in a first direction X parallel to a top face of the substrate 100. The first active pattern 110A and the second active pattern 110B may overlap each other in a direction (e.g., third direction Z) perpendicular to a top face of the substrate 100.

In some embodiments, the first active pattern 110A may include a plurality of nanosheet patterns (e.g., first to third nanosheet patterns 111, 112, and 113) sequentially stacked on the substrate 100 and spaced apart from each other. The first to third nanosheet patterns 111, 112, and 113 may be spaced apart from the substrate 100. In some embodiments, the second active pattern 110B may include a plurality of nanosheet patterns (e.g., fourth to sixth nanosheet patterns 114, 115, and 116) sequentially stacked on the first active pattern 110A and spaced apart from each other. The fourth to sixth nanosheet patterns 114, 115, and 116 may be spaced apart from the substrate 100 by a larger spacing than a spacing by which the first to third nanosheet patterns 111, 112, and 113 may be spaced apart from the substrate 100.

In some embodiments, a first fin pattern FP may be formed between the substrate 100 and the first active pattern 110A. The first fin pattern FP may protrude from the top face of the substrate 100 and extend in the first direction X. The first fin pattern FP may be formed by etching a portion of the substrate 100, or may be an epitaxial layer grown from the substrate 100.

Each of the first active pattern 110A and the second active pattern 110B may include an elemental semiconductor material such as silicon (Si) or germanium (Ge). Alternatively, each of the first active pattern 110A and the second active pattern 110B may include a compound semiconductor, for example, a group IV-IV compound semiconductor or a group III-V compound semiconductor. The group IV-IV compound semiconductor may include, for example, a binary compound including two of carbon (C), silicon (Si), germanium (Ge), and tin (Sn), a ternary compound including three thereof, or a compound obtained by doping a group IV element thereto. The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V element with each other, or a quaternary compound obtained by combining three of aluminum (Al), gallium (Ga), and indium (In) as a group III element and one of phosphorus (P), arsenic (As), and antimony (Sb) as a group V element with each other.

The field insulating film 105 may be formed on the substrate 100. The field insulating film 105 may cover at least a portion of a side face of the first fin pattern FP. Although it is shown that a top face of the field insulating film 105 is coplanar with a top face of the first fin pattern FP, this is only by way of example. In another example, the top face of the first fin pattern FP may protrude from the top face of the field insulating film 105. The field insulating film 105 may include, for example, at least one of silicon oxide, silicon nitride, silicon oxynitride, and combinations thereof. The present disclosure is not limited thereto.

The gate structure GS may be formed on the substrate 100 and the field insulating film 105. The gate structure GS may intersect the first active pattern 110A and the second active pattern 110B. For example, the gate structure GS may extend in a second direction Y which is parallel to the top face of the substrate 100 and intersects the first direction X. The gate structure GS may surround a side face of the first active pattern 110A and a side face of the second active pattern 110B. That is, each of the first active pattern 110A and the second active pattern 110B may extend in the first direction X and extend through the gate structure GS. As used herein, elements that "surround" or are "surrounding" another element may or may not completely surround the other element. The gate structure GS may include a gate dielectric film 120, a gate electrode LC, UC, and 140, a gate spacer 150, and a gate capping pattern 155.

The gate dielectric film 120 may be deposited on the first active pattern 110A and the second active pattern 110B. That is, the gate dielectric film 120 may surround the first active pattern 110A and the second active pattern 110B. Further, the gate dielectric film 120 may extend along a top face of the first fin pattern FP and a top face of the field insulating film 105.

In some embodiments, the gate dielectric film 120 may include a high dielectric film 124. The high dielectric film 124 may include a high dielectric constant material with a higher dielectric constant than that of silicon oxide. The high dielectric constant material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof. The present disclosure is not limited thereto.

In some embodiments, the gate dielectric film 120 may further include an interfacial film 122. The interfacial film 122 may be interposed between the first active pattern 110A and the high dielectric film 124 and between the second active pattern 110B and the high dielectric film 124. Although not specifically illustrated, the interfacial film 122 may be interposed between the first fin pattern FP and the high dielectric film 124. The interfacial film 122 may include a semiconductor oxide film. For example, when each of the first active pattern 110A and the second active pattern 110B includes silicon (Si), the interfacial film 122 may include a silicon oxide film. The interfacial film 122 may be formed by, for example, a chemical oxidation process, an ultraviolet oxidation (UV oxidation) process, or a dual plasma oxidation process. The present disclosure is not limited thereto.

The semiconductor device according to some embodiments may include an NC (negative capacitance) FET using a negative capacitor. For example, the gate dielectric film 120 may include a ferroelectric material film having ferroelectric properties and a paraelectric material film having paraelectric properties.

The ferroelectric material film may have negative capacitance, and the paraelectric material film may have positive capacitance. For example, when two or more capacitors are electrically connected in series to each other, and capacitance of each of the capacitors has a positive value, a total capacitance is smaller than capacitance of each individual capacitor. On the other hand, when at least one of two or more capacitors electrically connected in series to each other has a negative value, a total capacitance may have a positive value and may be greater than an absolute value of each individual capacitance.

When the ferroelectric material film with negative capacitance and the paraelectric material film with positive capacitance are electrically connected in series to each other, a total capacitance value of the ferroelectric material film and the paraelectric material film electrically connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further be doped with dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on which ferroelectric material the ferroelectric material film includes.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this context, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. The metal oxide contained in the paraelectric material film may include, for example, at least one of hafnium oxide, zirconium oxide and aluminum oxide, but the present disclosure is not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. The thickness of the ferroelectric material film may be, for example, in a range of about 0.5 to about 10 nm, but the present disclosure is not limited thereto. Because a critical thickness exhibiting the ferroelectric properties may be vary based on a type of the ferroelectric material, the thickness of the ferroelectric material film may vary depending on the type of the ferroelectric material.

In one example, the gate dielectric film 120 may include one ferroelectric material film. In another example, the gate dielectric film 120 may include a plurality of ferroelectric material films spaced apart from each other. The gate dielectric film 120 may have a stack structure in which a plurality of ferroelectric material films and a plurality of paraelectric material films are alternately stacked with each other.

Each of the gate electrodes LC, UC, and 140 may surround the gate dielectric film 120. That is, the gate dielectric film 120 may be interposed between the first active pattern 110A and each of the gate electrodes LC, UC and 140 and between the second active pattern 110B and each of the gate electrodes LC, UC and 140. Further, the gate dielectric film 120 may be interposed between the first fin pattern FP and the gate electrode LC, UC and 140 and between the field insulating film 105 and the gate electrode LC, UC and 140. The gate electrode LC, UC and 140 may be formed by, for example, a replacement process.

The gate electrode LC, UC and 140 may include a first work function adjusting film LC, a second work function adjusting film UC, and a filling conductive film 140.

The first work function adjusting film LC may be deposited on the first active pattern 110A. That is, the first work function adjusting film LC may surround the gate dielectric film 120 on the first active pattern 110A. Further, the first work function adjusting film LC may extend along a top face of the first fin pattern FP and a top face of the field insulating film 105. The first work function adjusting film LC may adjust a work function of a gate electrode LC and 140 intersecting the first active pattern 110A.

The second work function adjusting film UC may be deposited on the second active pattern 110B. That is, the second work function adjusting film UC may surround the gate dielectric film 120 on the second active pattern 110B. The second work function adjusting film UC may adjust a work function of a gate electrode UC and 140 intersecting the second active pattern 110B.

The first work function adjusting film LC and the second work function adjusting film UC may have different stack configurations. Thus, the gate electrode LC and 140 intersecting the first active pattern 110A and the gate electrode UC and 140 intersecting the second active pattern 110B may have different effective work functions.

In some embodiments, the first work function adjusting film LC may act as a work function adjusting film of a first conductivity type, and the second work function adjusting film UC may act as a work function adjusting film of a second conductivity type different from the first conductivity type. In one example, the first conductivity type may be a p-type and the second conductivity type may be a n-type. In this case, the effective work function of the first work function adjusting film LC may be greater than the effective work function of the second work function adjusting film UC. However, this is only by way of example. It should be appreciated that the first conductivity type may be a n-type and the second conductivity type may be a p-type.

The first work function adjusting film LC may include a first work function insulating film LWD and a first work function conductive film LWM. In some embodiments, the first work function insulating film LWD and the first work function conductive film LWM may be sequentially stacked on the gate dielectric film 120. That is, the first work function insulating film LWD may be interposed between the gate dielectric film 120 and the first work function conductive film LWM.

In some embodiments, the second work function adjusting film UC may include a second work function insulating film UWD and a second work function conductive film UWM. The second work function insulating film UWD and the second work function conductive film UWM may be sequentially stacked on the gate dielectric film 120. That is, the second work function insulating film UWD may be interposed between the gate dielectric film 120 and the second work function conductive film UWM. In some other embodiments, the second work function insulating film UWD may be omitted.

Each of the first work function insulating film LWD and the second work function insulating film UWD may include at least one metal oxide film. The metal oxide film may include an insulating film capable of controlling a work function of the gate electrode LC, UC, and 140, such as an insulating film made of at least one of AlO, LaO, and a combination thereof.

The number of metal oxide films of the second work function insulating film UWD may be smaller than or equal to the number of metal oxide films of the first work function insulating film LWD. For example, the first work function insulating film LWD may include m (m being a natural number) metal oxide films that are sequentially stacked on the first active pattern 110A, while the second work function insulating film UWD may include n (n being a natural number smaller than or equal to m) metal oxide films that are sequentially stacked on the second active pattern 110B. In some embodiments, the number of metal oxide films of the second work function insulating film UWD may be smaller than the number of metal oxide films of the first work function insulating film LWD. For example, n may be a natural number smaller than m.

At least some of the n metal oxide films of the second work function insulating film UWD may be identical with at least some of the m metal oxide films of the first work function insulating film LWD. In one example, the first work function insulating film LWD may include a first metal oxide film 132 and a second metal oxide film 134 that are sequentially stacked. The second work function insulating film UWD may include the first metal oxide film 132. In some embodiments, the second work function insulating film UWD may not include the second metal oxide film 134.

The first metal oxide film 132 and the second metal oxide film 134 may include different materials. In some embodiments, a work function of the first metal oxide film 132 may be greater than that of the second metal oxide film 134. In one example, the first metal oxide film 132 may include AlO, and the second metal oxide film 134 may include LaO.

Each of the first work function conductive film LWM and the second work function conductive film UWM may include at least one metal film. The metal film may include a conductive film capable of controlling a work function of the gate electrode LC, UC, and 140, for example, a metal film made of at least one of TiN, TaN, TiC, TaC, TiAlC, TiON, and combinations thereof.

The number of metal films of the second work function conductive film UWM may be smaller than or equal to the number of metal films of the first work function conductive film LWM. For example, the first work function conductive film LWM may include p (p being a natural number) metal films that are sequentially stacked on the first active pattern 110A, while the second work function conductive film UWM may include q (q being a natural number smaller than or equal to p) metal films that are sequentially stacked on the second active pattern 110B.

In some embodiments, at least some of the q metal films of the second work function conductive film UWM may be identical with at least some of the p metal films of the first work function conductive film LWM. In one example, each of the first work function conductive film LWM and the second work function conductive film UWM may include a first metal film 142 and a second metal film 148 that are sequentially stacked.

The first metal film 142 and the second metal film 148 may include different materials. In some embodiments, a work function of the first metal film 142 may be greater than a work function of the second metal film 148. In one example, the first metal film 142 may include TiN, and the second metal film 148 may include TiAlC.

The filling conductive film 140 may be deposited on each of the first work function adjusting film LC and the second work function adjusting film UC. The filling conductive film 140 may be disposed between both opposing portions of the gate spacer 150 to be described later and may fill a space defined by each of the first work function adjusting film LC and the second work function adjusting film UC. The filling conductive film 140 may include, for example, at least one of tungsten (W), aluminum (Al), and combinations thereof. The present disclosure is not limited thereto.

The gate spacer 150 may be formed on the substrate 100 and the field insulating film 105. The gate spacer 150 may extend along each of both opposing side faces or sidewalls of each of the gate electrodes LC, UC, and 140. In some embodiments, the gate dielectric film 120 may further extend along an inner side face of the gate spacer 150. For example, the gate dielectric film 120 may be interposed between each of the gate electrodes LC, UC, and 140 and the gate spacer 150. The gate dielectric film 120 may be formed us9ing a replacement process. The present disclosure is not limited thereto. The gate spacer 150 may include, for example, at least one of silicon nitride, silicon oxynitride, silicon oxycarbide, silicon boron nitride, silicon boron carbonitride, silicon oxycarbonitride, and combinations thereof. The present disclosure is not limited thereto.

The gate capping pattern 155 may extend along a top face of the gate electrode LC, UC, and 140. Although a top face of the gate capping pattern 155 is shown to be coplanar with a top face of the gate spacer 150, this is only an example. In another example, the gate capping pattern 155 may be formed to cover the top face of the gate spacer 150. The gate capping pattern 150 may include, for example, at least one of silicon nitride, silicon oxynitride, silicon oxycarbide, silicon boron nitride, silicon boron carbonitride, silicon oxycarbonitride, and combinations thereof. The present disclosure is not limited thereto.

The first source/drain area 160A may be formed on a side face of each of the gate electrode LC and 140. The first source/drain area 160A may be connected to the first active pattern 110A. That is, the first active pattern 110A extending in the first direction X may extend through the gate structure GS and be connected to the first source/drain area 160A.

In some embodiments, a first inner spacer 152A may be formed on a side face of the gate electrode LC and 140 and between adjacent ones of the first to third nanosheet patterns 111, 112, and 113. The first inner spacer 152A may further be formed between the first fin pattern 111 and the first nanosheet pattern 112. The first source/drain area 160A may be spaced apart from the gate electrode LC and 140 via the first inner spacer 152A.

The first inner spacer 152A may include, for example, at least one of silicon nitride, silicon oxynitride, silicon oxycarbide, silicon boron nitride, silicon boron carbonitride, silicon oxycarbonitride, and combinations thereof. The present disclosure is not limited thereto. The first inner spacer 152A may include the same material as that of the gate spacer 150, or may include a material different from that of the gate spacer 150. In some other embodiments, the first inner spacer 152A may be omitted.

The second source/drain area 160B may be formed on a side face of the gate electrode UC and 140. The second source/drain area 160B may be connected to the second active pattern 110B. That is, the second active pattern 110B extending in the first direction X may extend through the gate structure GS and be connected to the second source/drain area 160B.

In some embodiments, a second inner spacer 152B may be formed on a side face of the gate electrode UC and 140 and between adjacent ones of the fourth to sixth nanosheet patterns 114, 115, and 116. The second source/drain area 160B may be spaced apart from the gate electrode UC and 140 via the second inner spacer 152B.

The second inner spacer 152B may include, for example, at least one of silicon nitride, silicon oxynitride, silicon oxycarbide, silicon boron nitride, silicon boron carbonitride, silicon oxycarbonitride, and combinations thereof. The present disclosure is not limited thereto. The second inner spacer 152B may include the same material as that of each of the first inner spacer 152A and/or the gate spacer 150 or may include a material different from that of each of the first inner spacer 152A and/or the gate spacer 150. In some other embodiments, the second inner spacer 152B may be omitted.

Each of the first source/drain area 160A and the second source/drain area 160B may include an epitaxial layer. For example, each of the first source/drain area 160A and the second source/drain area 160B may be formed using an epitaxial growth method. In some embodiments, a cross section of each of the first source/drain area 160A and the second source/drain area 160B intersecting the first direction X may have a diamond shape, a pentagonal shape, or a hexagonal shape.

In some embodiments, the first source/drain area 160A may have a first conductivity type, and the second source/drain area 160B may have a second conductivity type different from the first conductivity type. In one example, the first conductivity type may be a p-type and the second conductivity type may be a n-type. In this case, the first active pattern 110A may act as a channel area of PFET, and the second active pattern 110B may act as a channel area of NFET. However, this is only by way of example. It should be appreciated that the first conductivity type may be a n-type and the second conductivity type may be a p-type.

When a semiconductor device including the first active pattern 110A or the second active pattern 110B is embodied as PFET, the first source/drain area 160A or the second source/drain area 160B contains p-type impurities, or impurities for preventing diffusion of p-type impurities. In one example, the first source/drain area 160A may contain at least one of B, C, In, Ga, Al, and combinations thereof.

In some embodiments, when the semiconductor device including the first active pattern 110A or the second active pattern 110B is embodied as PFET, the first source/drain area 160A or the second source/drain area 160B may further include a compressive stress material. In one example, when the first active pattern 110A includes silicon (Si), the first source/drain area 160A may include a material (e.g., silicon germanium (SiGe)) having a larger lattice constant than that of silicon (Si). The compressive stress material may apply compressive stress to the first active pattern 110A or the second active pattern 110B to improve carrier mobility in the channel area.

When the semiconductor device including the first active pattern 110A or the second active pattern 110B is embodied as NFET, the first source/drain area 160A or the second source/drain area 160B may contain n-type impurities or impurities for preventing diffusion of n-type impurities. In one example, the second source/drain area 160B may contain at least one of P, Sb, As, and combinations thereof.

In some embodiments, when the semiconductor device including the first active pattern 110A or the second active pattern 110B is embodied as NFET, the first source/drain area 160A or the second source/drain area 160B may further include a tensile stress material. In one example, when the second active pattern 110B includes silicon (Si), the second source/drain area 160B may include a material (e.g., SiC) having a smaller lattice constant than that of silicon (Si). The tensile stress material may apply tensile stress to the first active pattern 110A or the second active pattern 110B to improve carrier mobility in the channel area.

The first separating insulating film 180 may be formed on the substrate 100 and the field insulating film 105. The first separating insulating film 180 may electrically separate the second source/drain area 160B from the first source/drain area 160A from each other. For example, the first separating insulating film 180 may cover the first source/drain area 160A. The second source/drain area 160B may be formed on the first separating insulating film 180.

The first separating insulating film 180 may include, for example, at least one of silicon oxide, silicon oxynitride, and a low dielectric constant material. The low dielectric constant material may include, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, and combinations thereof. The present disclosure is not limited thereto.

The interlayer insulating film 185 may be formed on the gate structure GS, the second source/drain area 160B, and the first separating insulating film 180. For example, the interlayer insulating film 185 may cover a side face of the gate structure GS, a top face of the second source/drain area 160B, and a top face of the first separating insulating film 180. In some embodiments, a top face of the interlayer insulating film 185 may be coplanar with a top face of the gate capping pattern 155.

The interlayer insulating film 185 may include, for example, at least one of silicon oxide, silicon oxynitride, and a low dielectric constant material. The present disclosure is not limited thereto. The interlayer insulating film 185 may include the same material as that of the first separating insulating film 180 or may include a material other than that of the first separating insulating film 180.

The first source/drain contact 190A may be electrically connected to the first source/drain area 160A. For example, as shown in FIG. 5, the first source/drain area 160A may extend in the third direction Z intersecting the top face of the substrate 100 and extend through the interlayer insulating film 185, the second source/drain area 160B, and the first separating insulating film 180. The first source/drain contact 190A may not be electrically connected to the second source/drain area 160B. For example, a contact insulating film 195 extending along a side face or sidewall of the first source/drain contact 190A may be formed. Due to the contact insulating film 195, the first source/drain contact 190A may be electrically connected to the first source/drain area 160A while not being electrically connected to the second source/drain area 160B.

The second source/drain contact 190B may be electrically connected to the second source/drain area 160B. For example, as shown in FIG. 3, the second source/drain area 160B may extend in the third direction Z and extend through the interlayer insulating film 185. The second source/drain contact 190B may not be electrically connected to the first source/drain area 160A. For example, the second source/drain contact 190B may not extend through the first separating insulating film 180.

The third source/drain contact 190C may be electrically connected to both the first source/drain area 160A and the second source/drain area 160B. For example, as shown in FIG. 4, the third source/drain contact 190C may extend in the third direction Z and extend through the interlayer insulating film 185, the second source/drain area 160B, and the first separating insulating film 180.

The arrangement of the first source/drain contact 190A, the second source/drain contact 190B, and the third source/drain contact 190C and the number thereof as described above are merely by way of example and are not limited thereto.

The semiconductor device according to some embodiments may implement multiple threshold voltages using the first work function adjusting film LC and the second work function adjusting film UC. Specifically, as described above, the first work function adjusting film LC and the second work function adjusting film UC may include different stacks of the metal oxide films (e.g., the first work function insulating film LWD and the second work function insulating film UWD) and/or different stacks of the metal films (e.g., the first work function conductive film LWM and the second work function conductive film UWM), and thus may have different effective work functions.

Further, the first work function adjusting film LC may surround the first active pattern 110A, and the second work function adjusting film UC may surround the second active pattern 110B. Thus, the semiconductor device including multi-gate transistors stacked in a vertical direction (e.g., the third direction Z) and having different threshold voltages may be provided.

FIG. 6A to FIG. 14 are various cross-sectional views for illustrating a semiconductor device according to some embodiments. For convenience of description, the same components and configurations as those described based on FIG. 1 to FIG. 5 are briefly described or omitted. For reference, FIG. 6B to FIG. 10B are enlarged views to illustrate a R1 area and a R2 area of FIG. 6A to FIG. 10A, respectively.

Figure 6A:
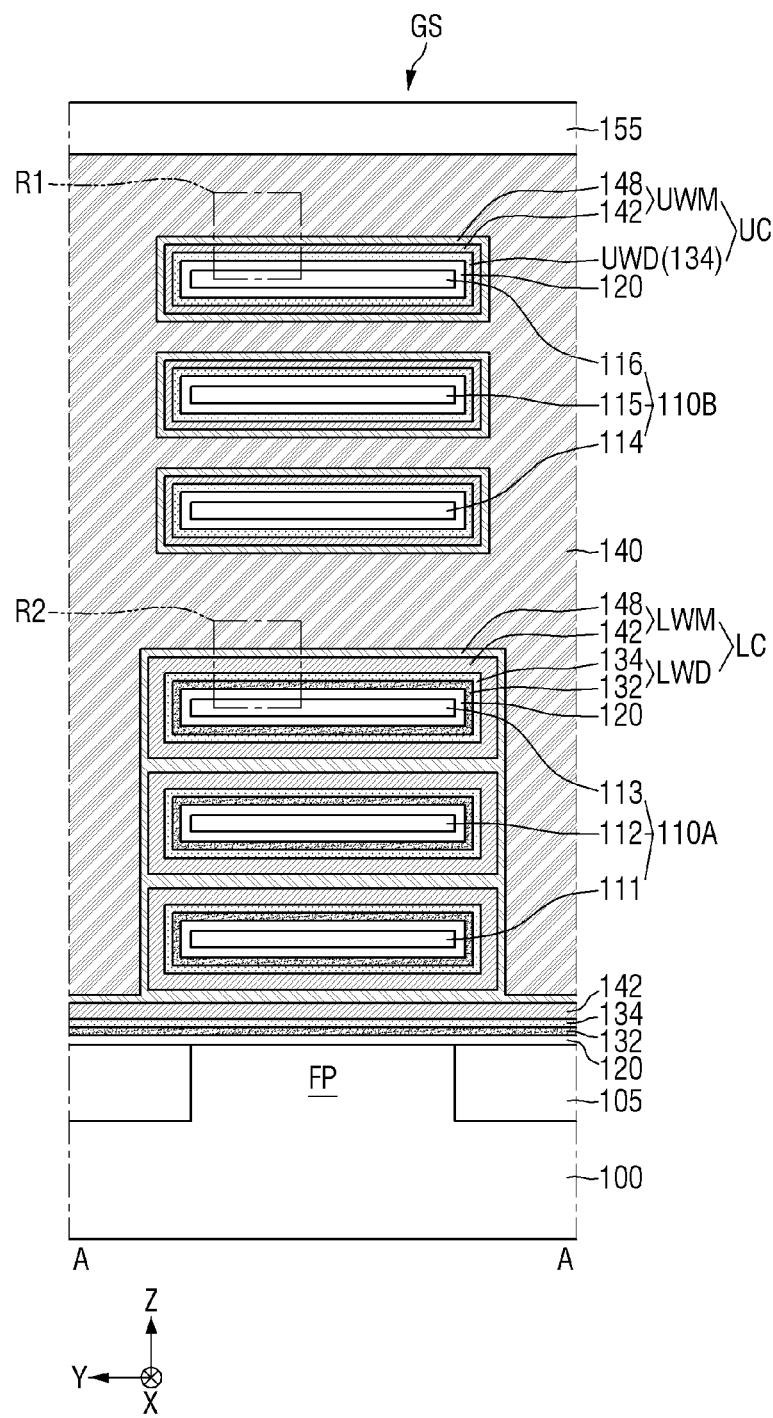
FIGS. 6A, 6B, 7A, 7B, 8A, 8B, 9A, 9B, 10, 11, 12, 13, and 14 are various cross-sectional views for illustrating a semiconductor device according to some embodiments.
Figure 6B:
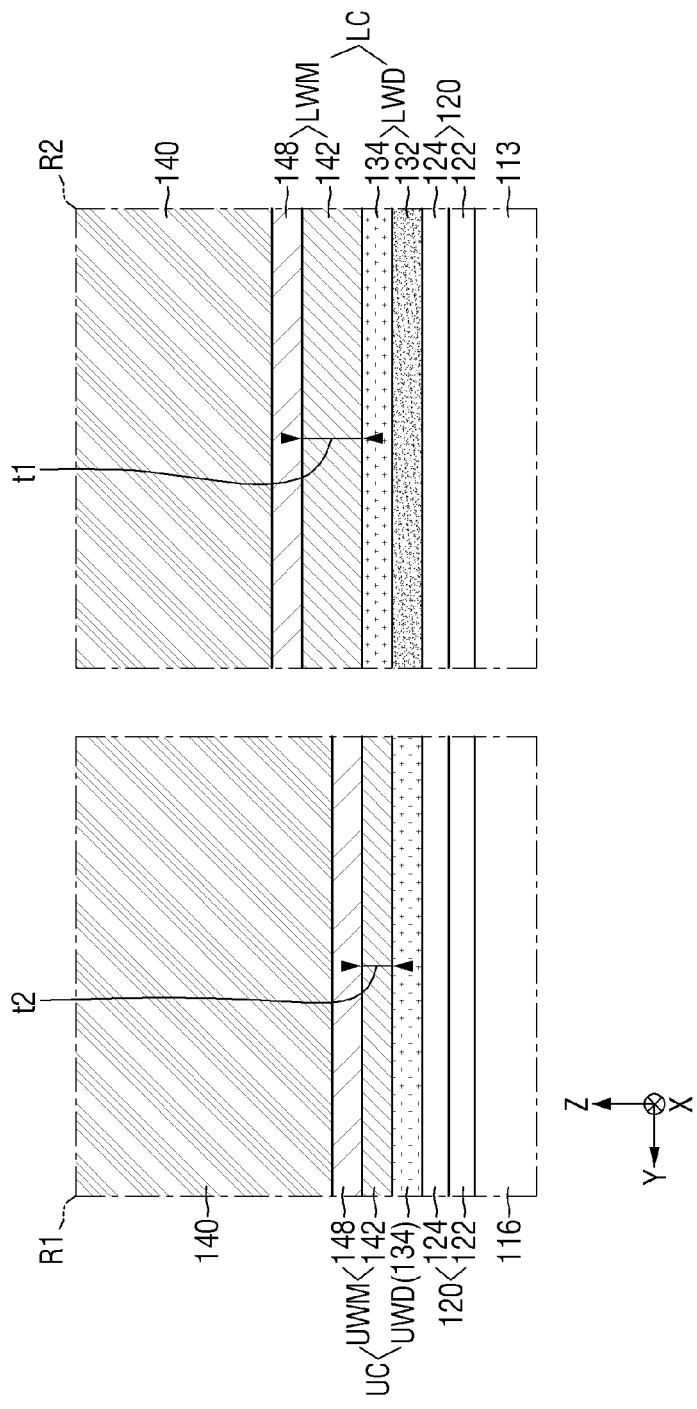

Referring to FIG. 6A and FIG. 6B, in a semiconductor device according to some embodiments, the first metal film 142 of the first work function conductive film LWM and the first metal film 142 of the second work function conductive film UWM have different thicknesses of the same material.

In some embodiments, a thickness t1 of the first metal film 142 of the first work function conductive film LWM may be greater than a thickness t2 of the first metal film 142 of the second work function conductive film UWM. For example, the thickness t1 of the first metal film 142 may be larger by about 1.5 to about 3 times than the thickness t2 of the first metal film 142 of the second work function conductive film UWM.

In some embodiments, the first active pattern 110A may act as a channel area of PFET, and the second active pattern 110B may act as a channel area of NFET.

Referring to FIG. 7A to FIG. 8B, in the semiconductor device according to some embodiments, the number of metal films of the second work function conductive film UWM may be smaller than the number of metal films of the first work function conductive film LWM.

For example, the first work function conductive film LWM may include p (p being a natural number) metal films stacked sequentially on the first active pattern 110A, while the second work function conductive film UWM may include q (q being a natural number smaller than p) metal films sequentially stacked on the second active pattern 110B. In some embodiments, at least some of the q metal films of the second work function conductive film UWM may be identical (e.g., of the same material and thickness) with at least some of the p metal films of the first work function conductive film LWM.

Figure 7A:
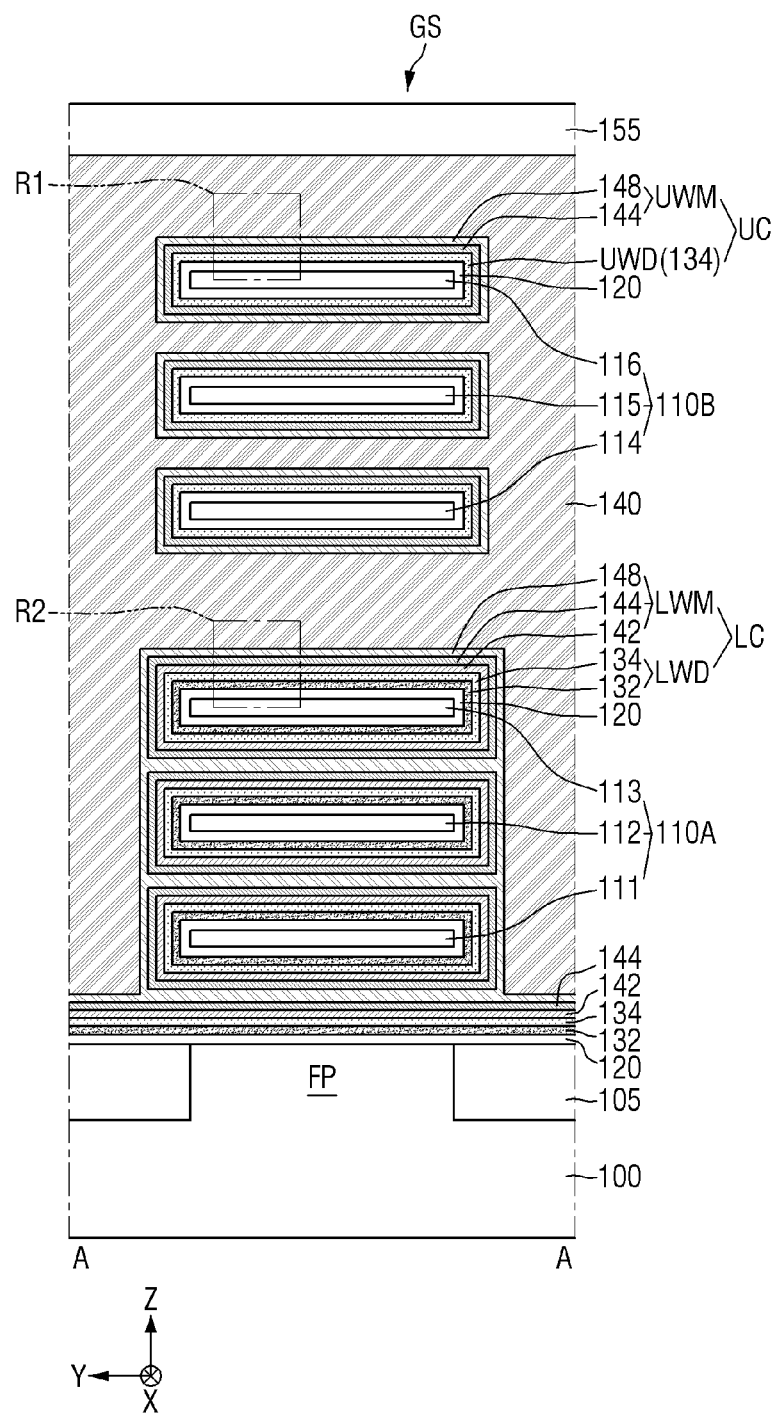
Figure 7B:
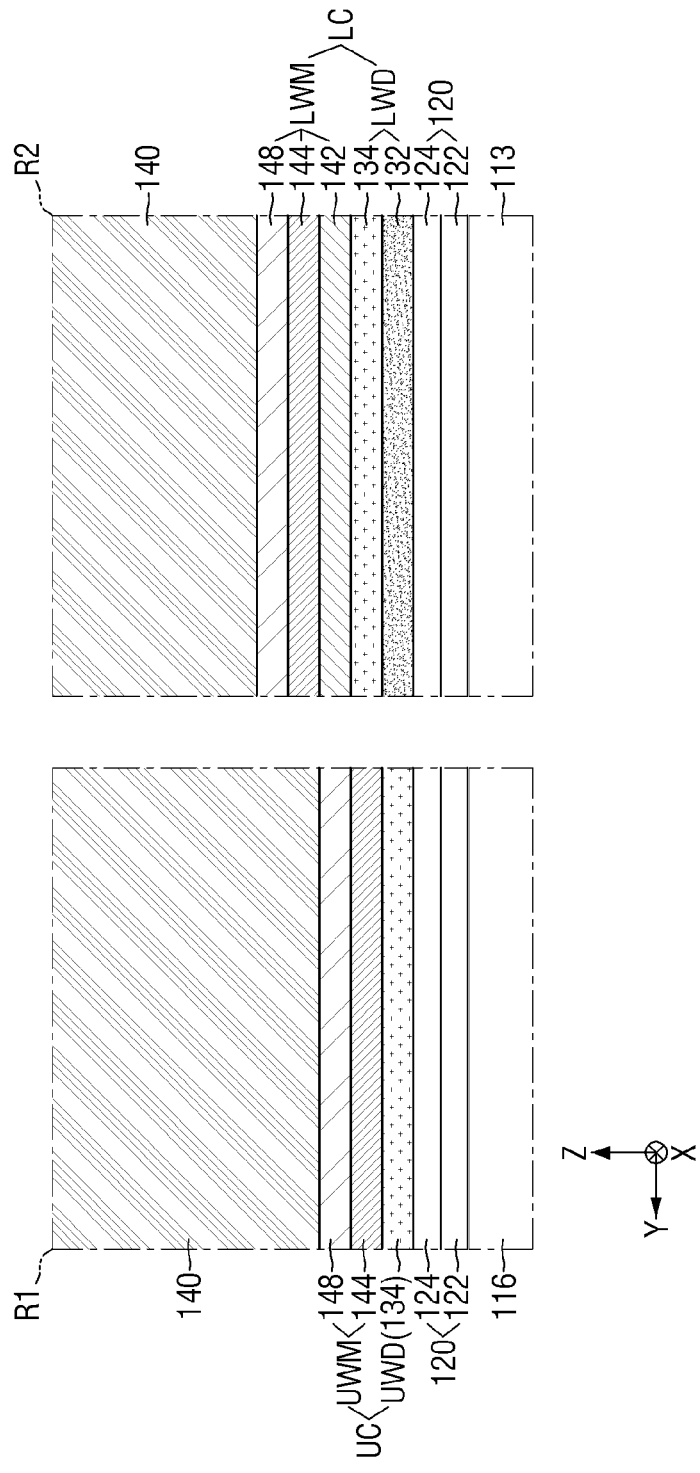

In one example, as shown in FIG. 7A and FIG. 7B, the first work function conductive film LWM may include the first metal film 142, a third metal film 144 and a second metal film 148 that are sequentially stacked. The second work function conductive film UWM may include the third metal film 144 and the second metal film 148 that are sequentially stacked. In some embodiments, the second work function conductive film UWM may not include the first metal film 142.

Figure 8A:
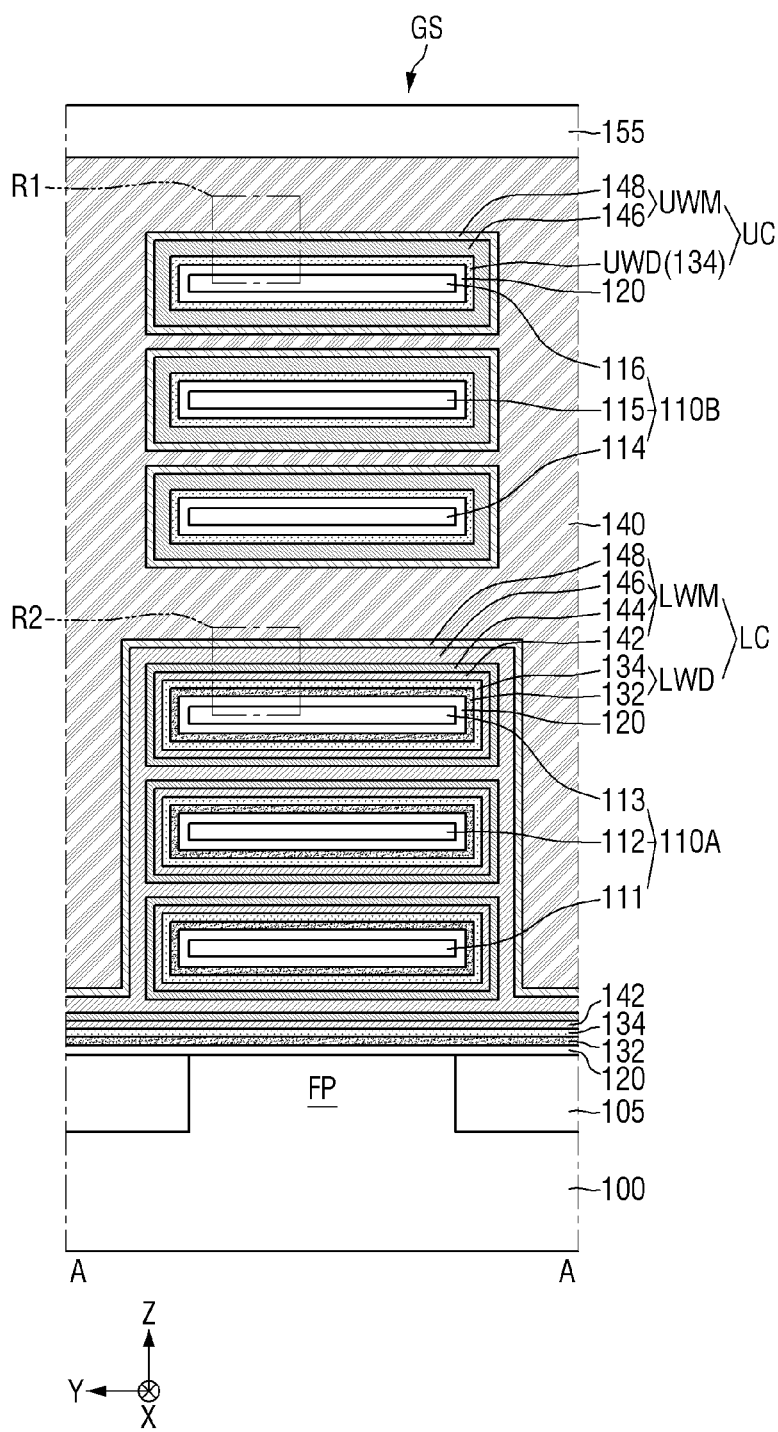
Figure 8B:
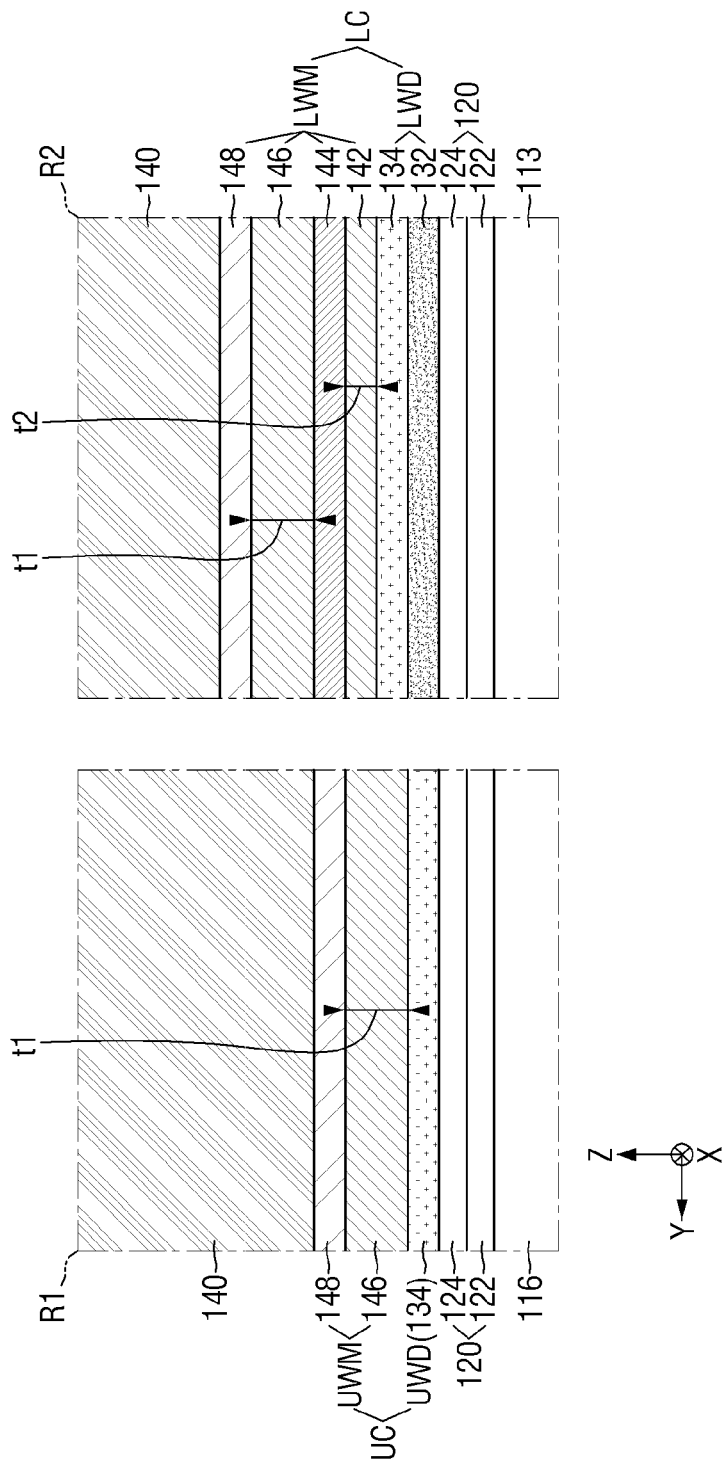

In another example, as shown in FIG. 8A and FIG. 8B, the first work function conductive film LWM may include the first metal film 142, the third metal film 144, a fourth metal film 146 and the second metal film 148 that are sequentially stacked. The second work function conductive film UWM may include the fourth metal film 146 and the second metal film 148 that are sequentially stacked. In some embodiments, the second work function conductive film UWM may not include the first metal film 142 and the third metal film 144.

In some embodiments, the third metal film 144 may include a material different from that of the first metal film 142. In one example, the first metal film 142 may include TiN, while the third metal film 144 may include TiAlC.

In some embodiments, the third metal film 144 may include the same material as that of the second metal film 148. In one example, both the second metal film 148 and the third metal film 144 may include TiAlC. In some embodiments, a material composition of the third metal film 144 may be different from a material composition of the second metal film 148. In one example, the second metal film 148 may include TiAlC at a first Al content, while the third metal film 144 may include TiAlC at a second Al content different from the first Al content.

In some embodiments, the fourth metal film 146 may include the same material as that of the first metal film 142. In one example, both the first metal film 142 and the fourth metal film 146 may include TiN.

In some embodiments, a thickness t1 of the fourth metal film 146 may be greater than a thickness t2 of the first metal film 142. For example, the thickness t1 of the fourth metal film 146 may be larger by about 1.5 to about 3 times than the thickness t2 of the first metal film 142 of the second work function conductive film UWM.

Referring to FIG. 9A to FIG. 10B, in a semiconductor device according to some embodiments, at least some of the m metal oxide films of the first work function insulating film LWD may be interposed between the p metal films of the first work function conductive film LWM.

Figure 9A:
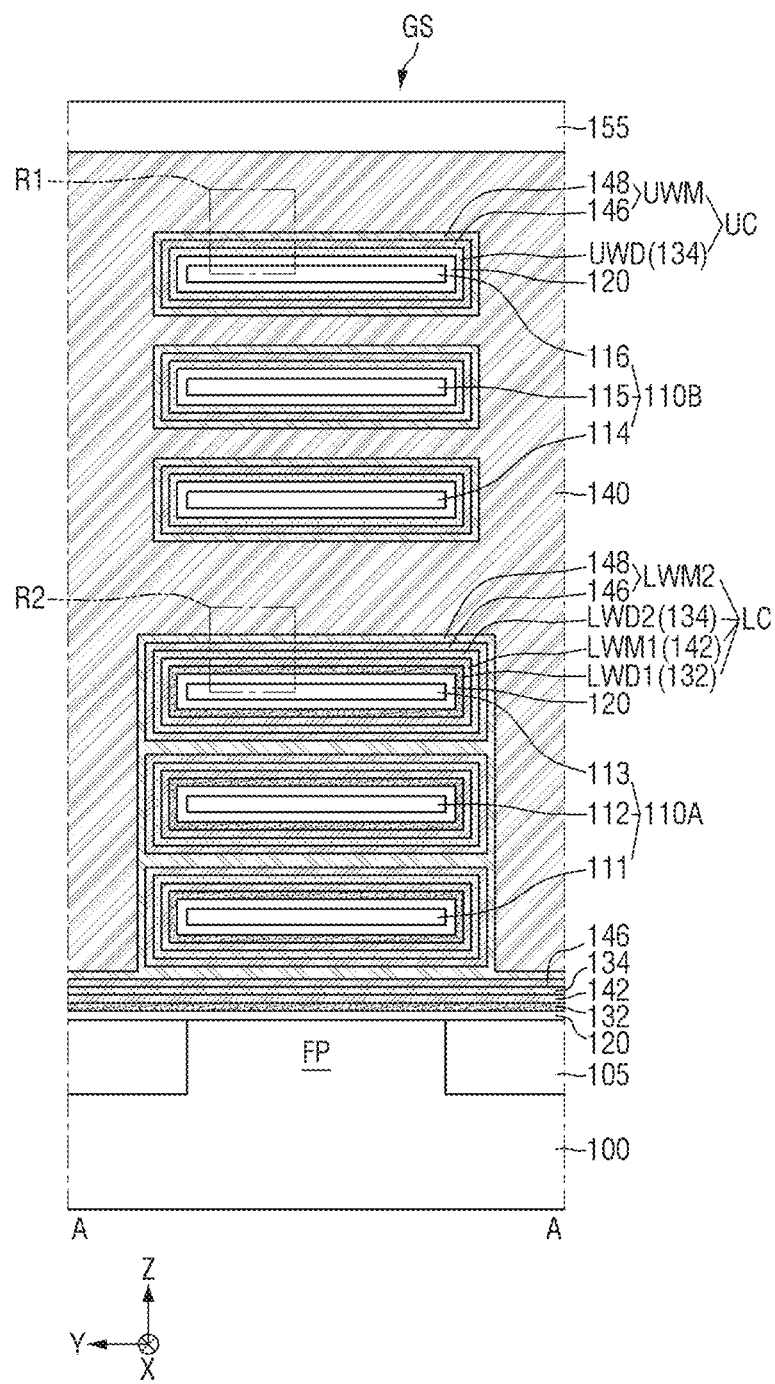
Figure 9B:
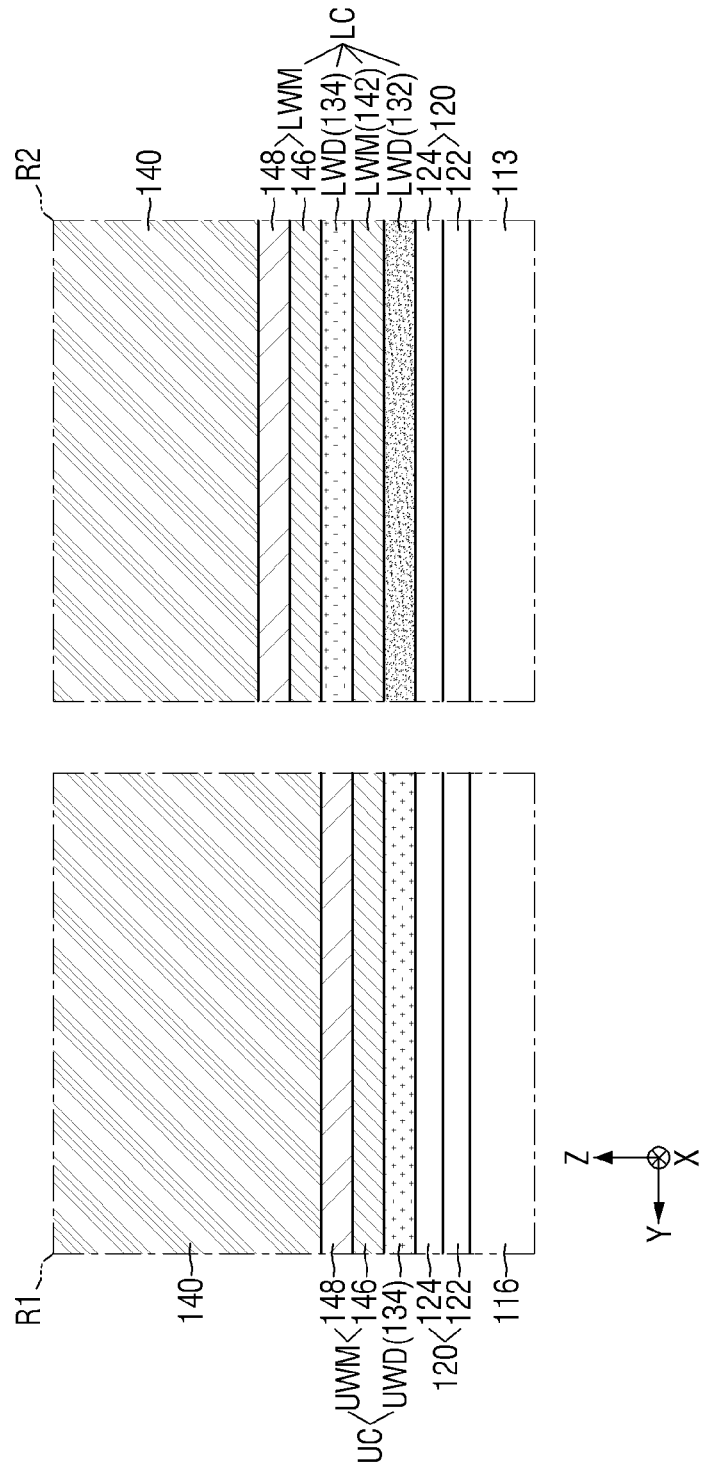

In one example, as shown in FIG. 9A and FIG. 9B, the first work function adjusting film LC may include the first work function insulating film LWD, the first metal oxide film 132 and the second metal oxide film 134 that are sequentially stacked. The first work function conductive film LWM may include the first metal film 142, the fourth metal film 146, and the second metal film 148 that are sequentially stacked. In this connection, the second metal oxide film 134 may be interposed between the first metal film 142 and the fourth metal film 146.

In some embodiments, the first metal oxide film 132 may be interposed between the gate dielectric film 120 and the first metal film 142.

In some embodiments, the second work function insulating film UWD may include the second metal oxide film 134, while the second work function conductive film UWM may include the fourth metal film 146 and the second metal film 148 that are sequentially stacked.

In some embodiments, the second work function insulating film UWD may not include the first metal oxide film 132, and the second work function conductive film UWM may not include the first metal film 142.

Figure 10A:
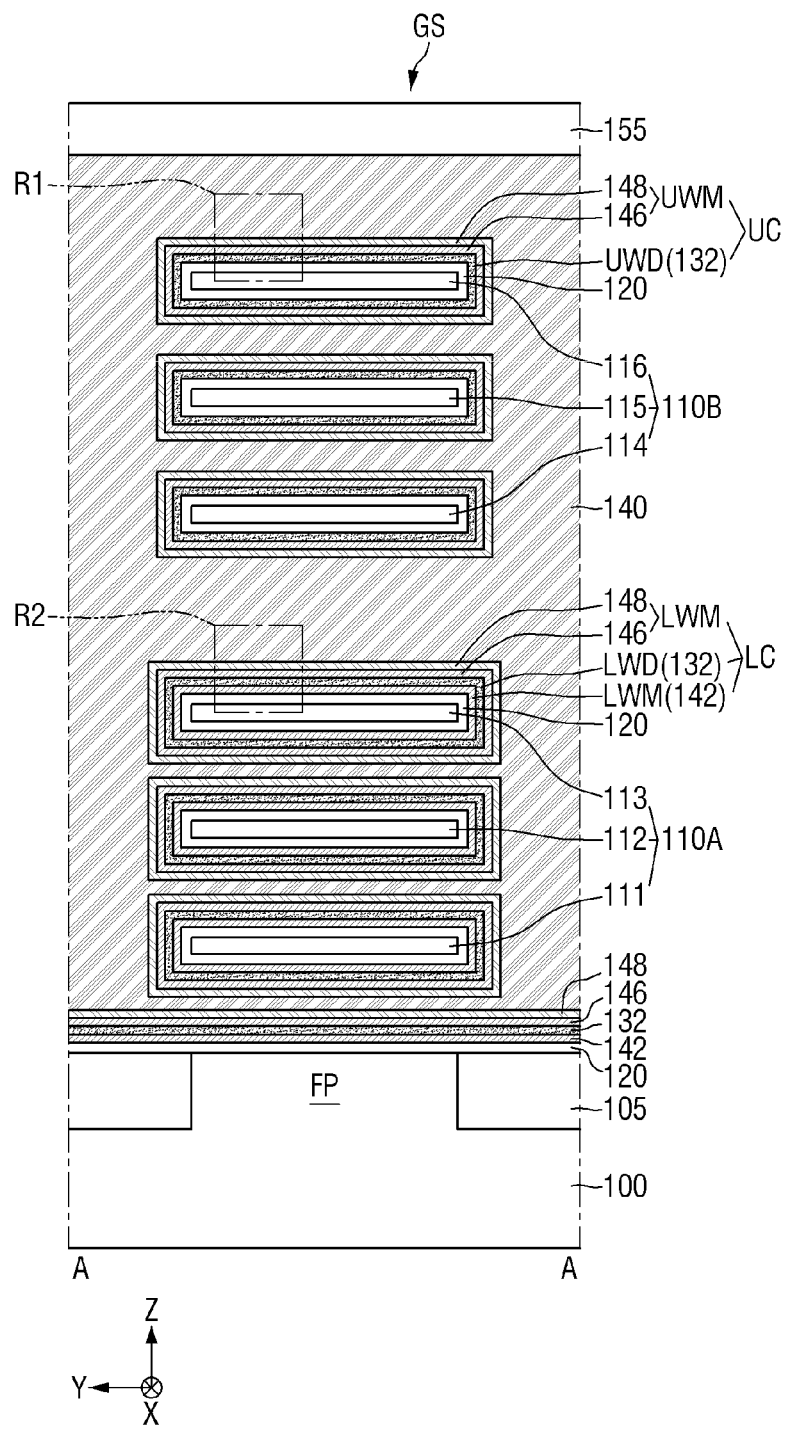
Figure 10B:
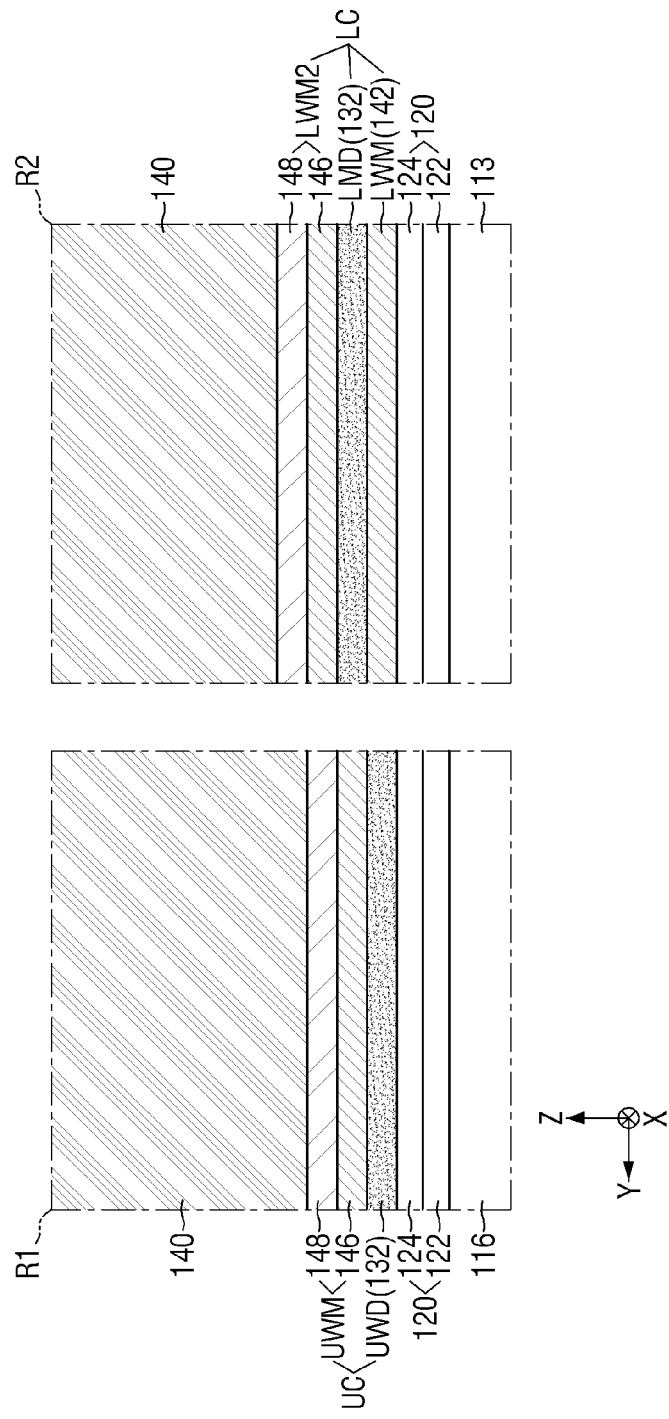

In another example, as shown in FIG. 10A and FIG. 10B, the first work function insulating film LWD may include the first metal oxide film 132. The first work function conductive film LWM may include the first metal film 142, the fourth metal film 146, and the second metal film 148 that are sequentially stacked. In this context, the first metal oxide film 132 may be interposed between the first metal film 142 and the fourth metal film 146. The first metal oxide film 132 may include, for example, at least one of AlO, LaO, and a combination thereof.

In some embodiments, the first work function insulating film LWD may not include the second metal oxide film 134.

In some embodiments, the second work function insulating film UWD may include the first metal oxide film 132. The second work function conductive film UWM may include the fourth metal film 146 and the second metal film 148 that are sequentially stacked. In some embodiments, the second work function insulating film UWD may not include the second metal oxide film 134, and the second work function conductive film UWM may not include the first metal film 142.

Figure 11:
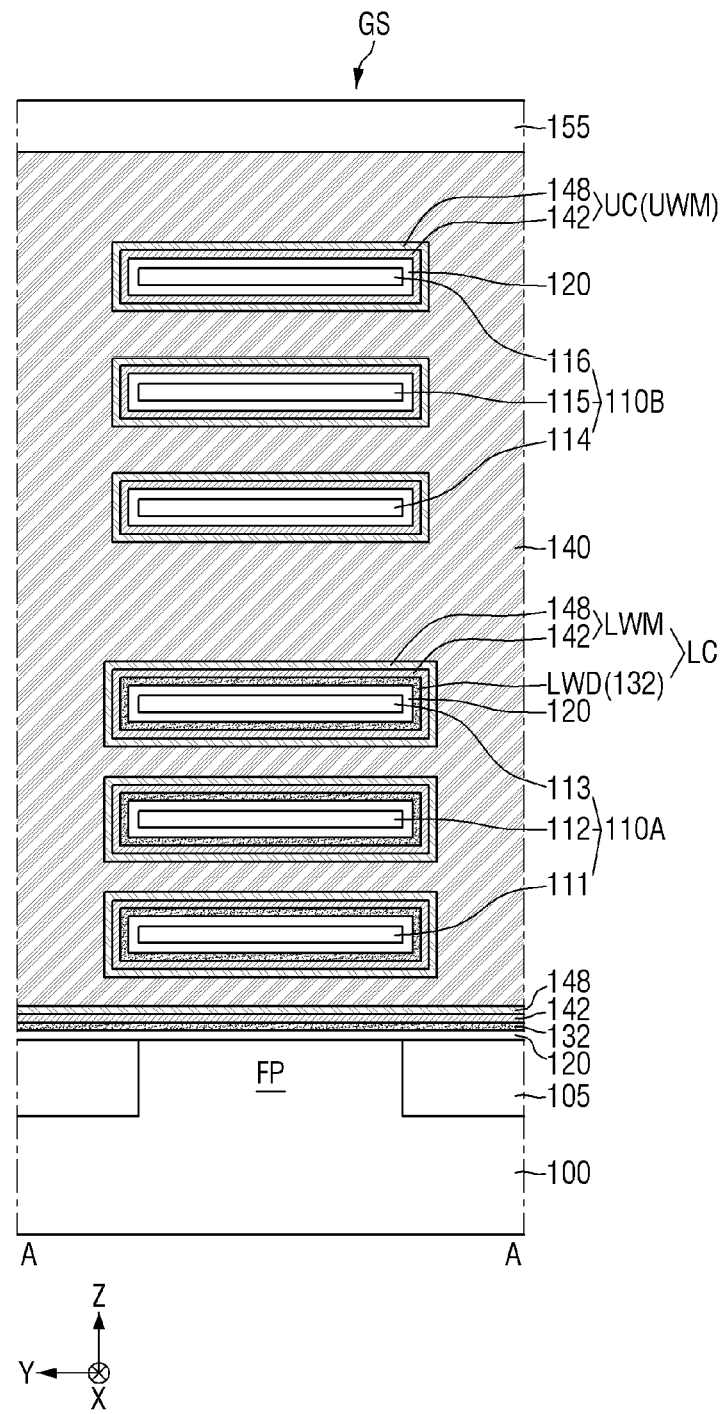

Referring to FIG. 11, in a semiconductor device according to some embodiments, the second work function adjusting film UC does not include a metal oxide film.

For example, the second work function adjusting film UC may not include the second work function insulating film UWD as described above with reference to FIG. 1 to FIG. 10B. In this case, the second work function conductive film UWM may be in contact with the gate dielectric film 120.

The first work function adjusting film LC may include the first work function insulating film LWD. In one example, the first work function insulating film LWD may include the first metal oxide film 132. The first metal oxide film 132 may include, for example, at least one of AlO, LaO, and a combination thereof.

Figure 12:
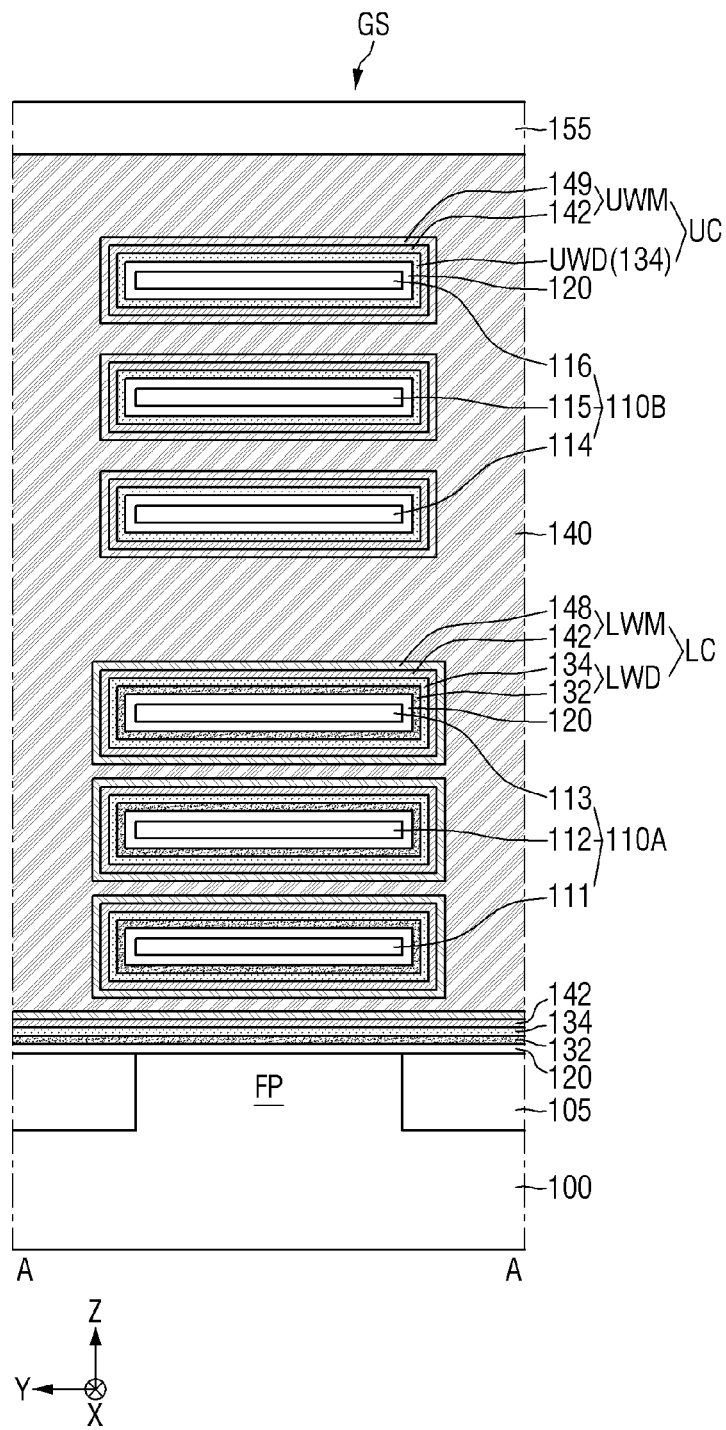

Referring to FIG. 12, in a semiconductor device according to some embodiments, an outermost metal film of the first work function conductive film LWM is different from an outermost metal film of the second work function conductive film UWM.

In one example, the first work function conductive film LWM may include the first metal film 142 and the second metal film 148 that are sequentially stacked. The second work function conductive film UWM may include the first metal film 142 and a fifth metal film 149 that are sequentially stacked. The second metal film 148 may act as an outermost metal film of the first work function conductive film LWM, and the fifth metal film 149 may act as an outermost metal film of the second work function conductive film UWM. In this connection, the fifth metal film 149 may be different from the second metal film 148.

In some embodiments, the fifth metal film 149 may include the same material as that of the second metal film 148. In one example, both the second metal film 148 and the fifth metal film 149 may include TiAlC. In some embodiments, a material composition of the fifth metal film 149 may be different from a material composition of the second metal film 148. In one example, the second metal film 148 may include TiAlC at a first Al content, while the fifth metal film 149 may include TiAlC at a third Al content different from the first Al content.

Figure 13:
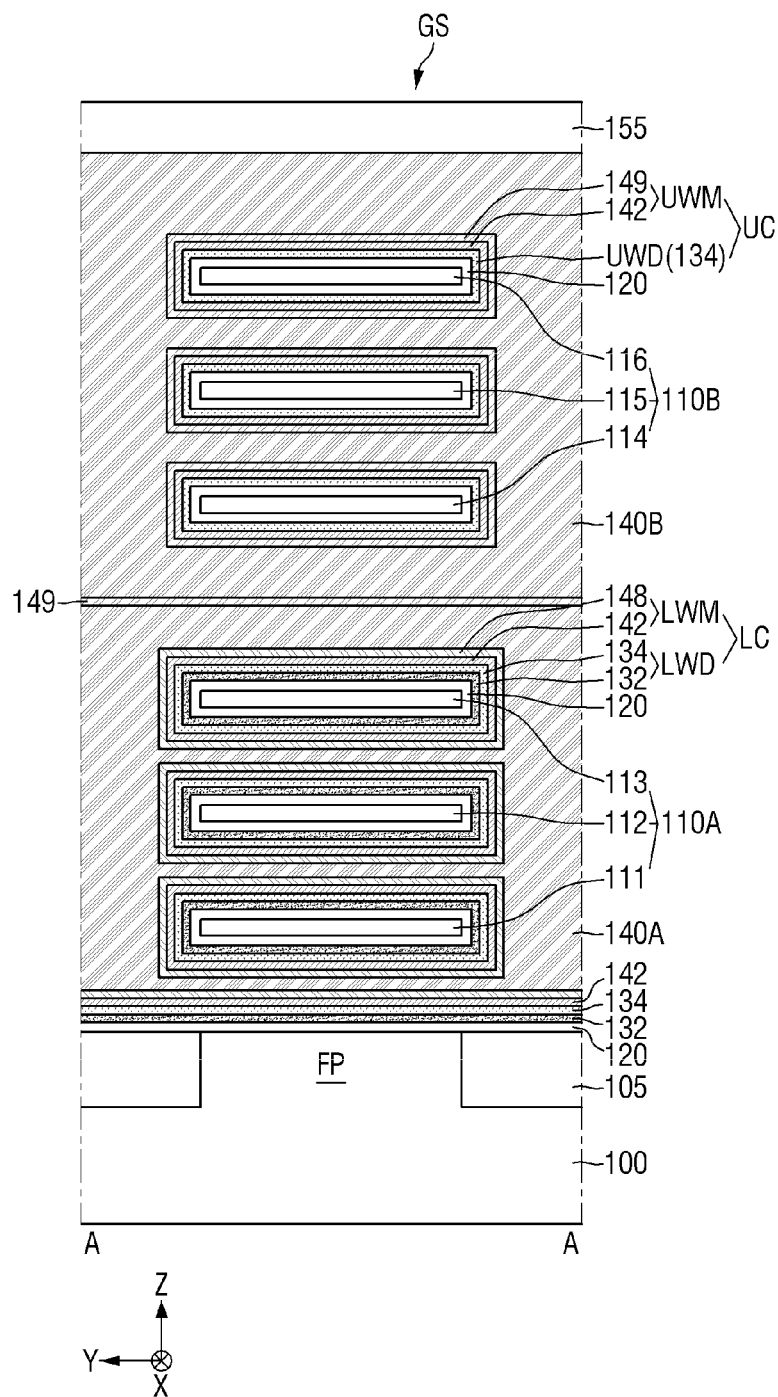

Referring to FIG. 13, in a semiconductor device according to some embodiments, the gate structure GS includes a first filling conductive film 140A and a second filling conductive film 140B.

The first filling conductive film 140A may be deposited on the first work function adjusting film LC, and the second filling conductive film 140B may be deposited on the second work function adjusting film UC. The second filling conductive film 140B may cover a top face of the first filling conductive film 140A.

In some embodiments, at least some of the q metal films of the second work function conductive film UWM may extend along the top face of the first filling conductive film 140A. In one example, the second work function conductive film UWM may include the first metal film 142 and a fifth metal film 149 that are sequentially stacked. In this connection, the fifth metal film 149 may extend along the top face of the first filling conductive film 140A. In a different manner from that in the drawings, both the first metal film 142 and the fifth metal film 149 may extend along the top face of the first filling conductive film 140A.

Figure 14:
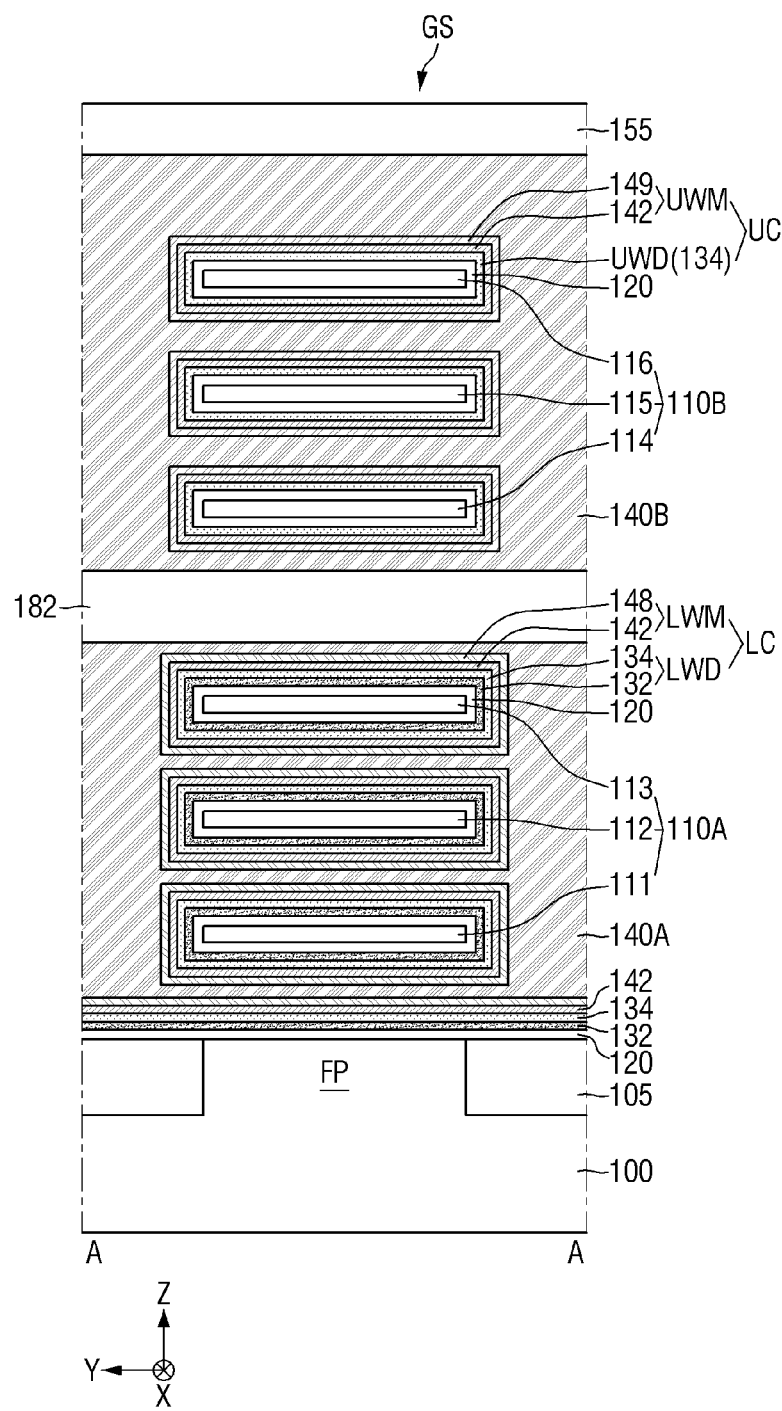

Referring to FIG. 14, in a semiconductor device according to some embodiments, the gate structure GS further includes a second separating insulating film 182.

The second separating insulating film 182 may be interposed between the first filling conductive film 140A and the second filling conductive film 140B. The second separating insulating film 182 may electrically separate the second filling conductive film 140B from the first filling conductive film 140A from each other. For example, the second separating insulating film 182 may cover the top face of the first filling conductive film 140A. The second filling conductive film 140B may cover a top face of the second separating insulating film 182.

The second separating insulating film 182 may include, for example, at least one of silicon oxide, silicon oxynitride, and a low dielectric constant material. The present disclosure is not limited thereto. The second separating insulating film 182 may include the same material as that of each of the first separating insulating film 180 and/or the interlayer insulating film 185, or may include a material other than that of each of the first separating insulating film 180 and/or the interlayer insulating film 185.

Figure 15:
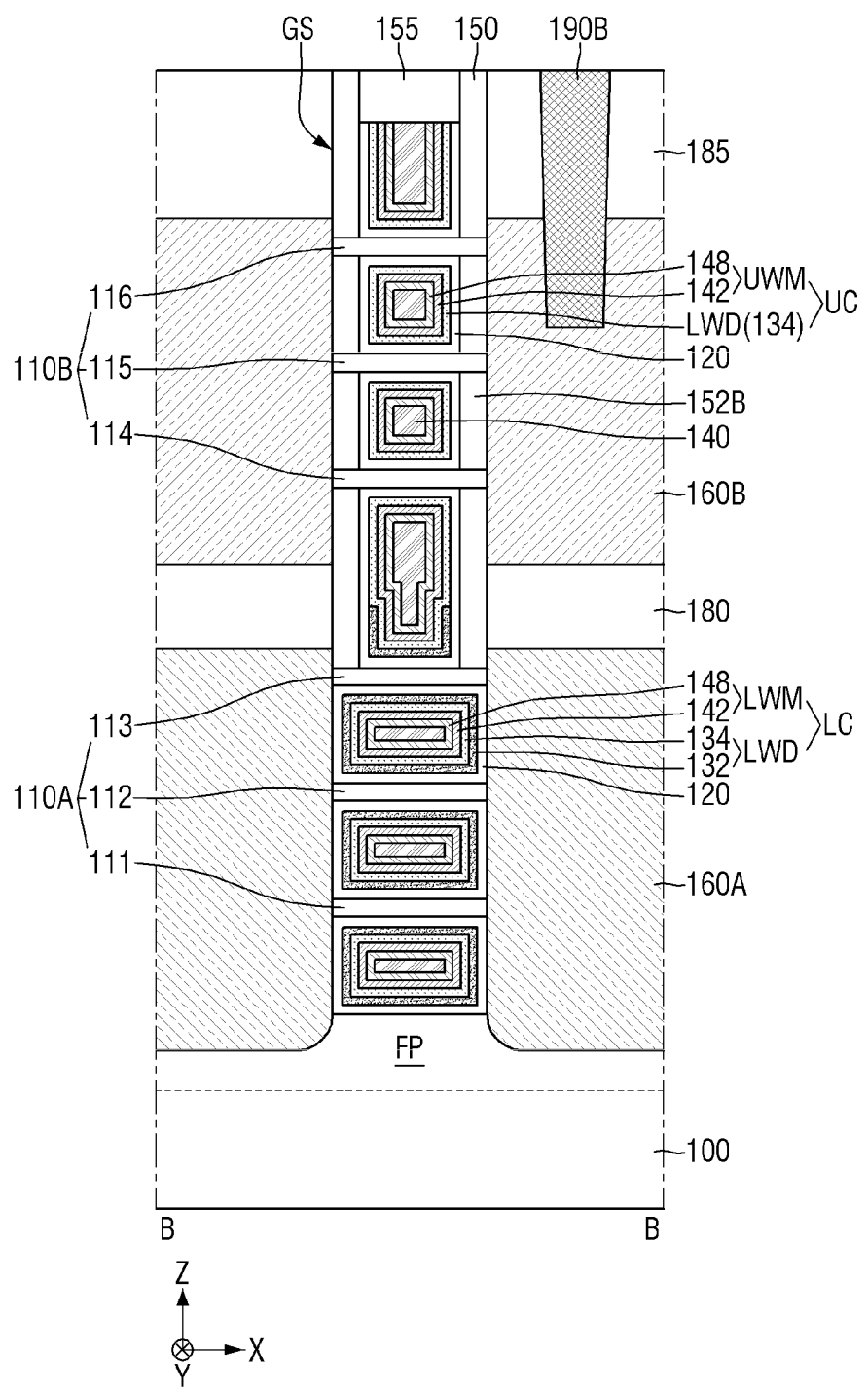
FIGS. 15 and 16 are various cross-sectional views for illustrating a semiconductor device according to some embodiments.
Figure 16:
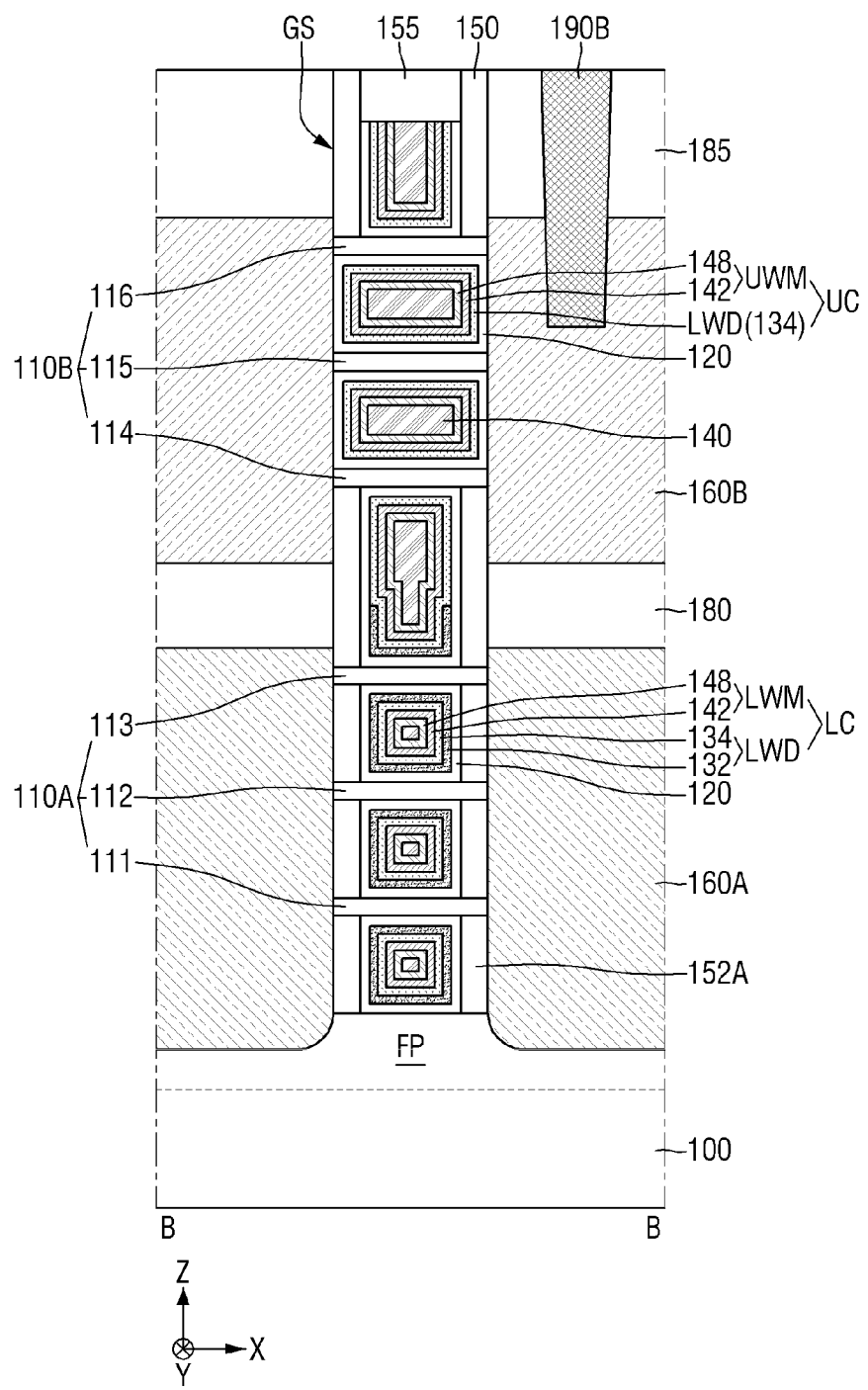

FIGS. 15 and 16 are various cross-sectional views for illustrating a semiconductor device according to some embodiments. For reference, FIG. 15 and FIG. 16 are different cross-sectional views taken along a line B-B of FIG. 1, respectively. For convenience of description, the same components and configurations as those described based on FIG. 1 to FIG. 14 are briefly described or omitted. For reference, FIG. 6B to FIG. 10B are enlarged views for illustrating a R1 area and a R2 area of FIG. 6A to FIG. 10A, respectively.

Referring to FIG. 15, a semiconductor device according to some embodiments does not include the first inner spacer (152A in FIGS. 3 to 5).

The first source/drain area 160A may be electrically separated from the gate electrode LC and 140 via the gate dielectric film 120. In some embodiments, the first active pattern 110A may act as a channel area of PFET, and the second active pattern 110B may act as a channel area of NFET. For example, the first source/drain area 160A may contain p-type impurities. The second source/drain area 160B may contain n-type impurities.

Referring to FIG. 16, a semiconductor device according to some embodiments does not include the second inner spacer (152B in FIGS. 3 to 5).

The second source/drain area 160B may be electrically separated from the gate electrode UC and 140 via the gate dielectric film 120. In some embodiments, the first active pattern 110A may act as a channel area of NFET, and the second active pattern 110B may act as a channel area of PFET. For example, the first source/drain area 160A may contain n-type impurities, and the second source/drain area 160B may contain p-type impurities.

Figure 17:
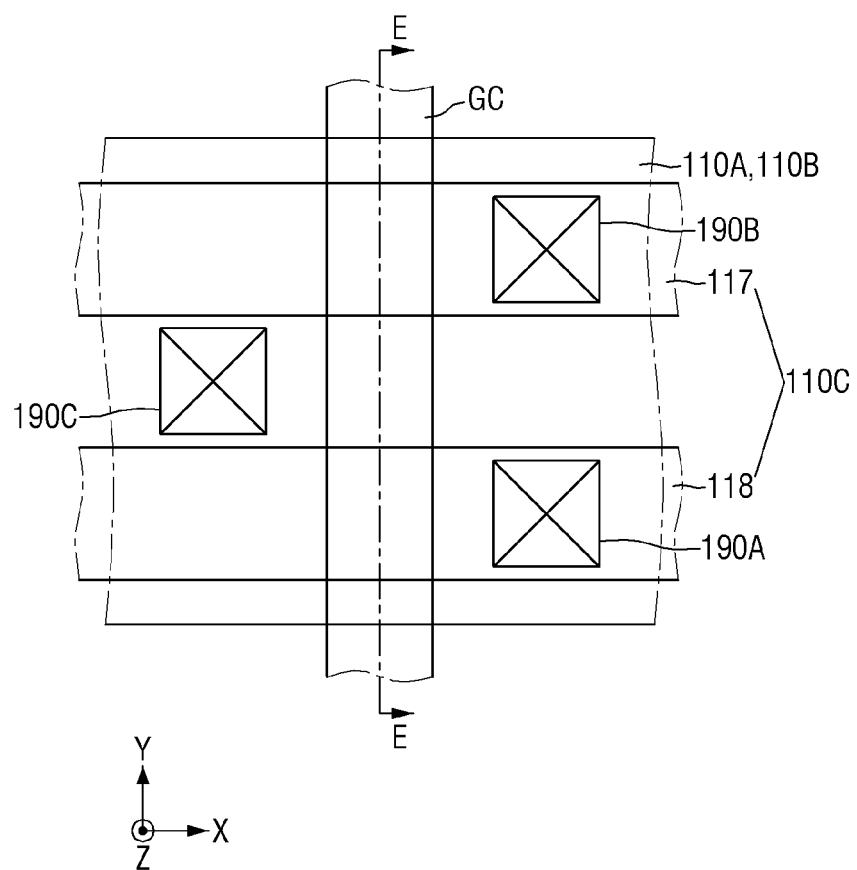
FIG. 17 is an example layout diagram for illustrating a semiconductor device according to some embodiments.
Figure 18:
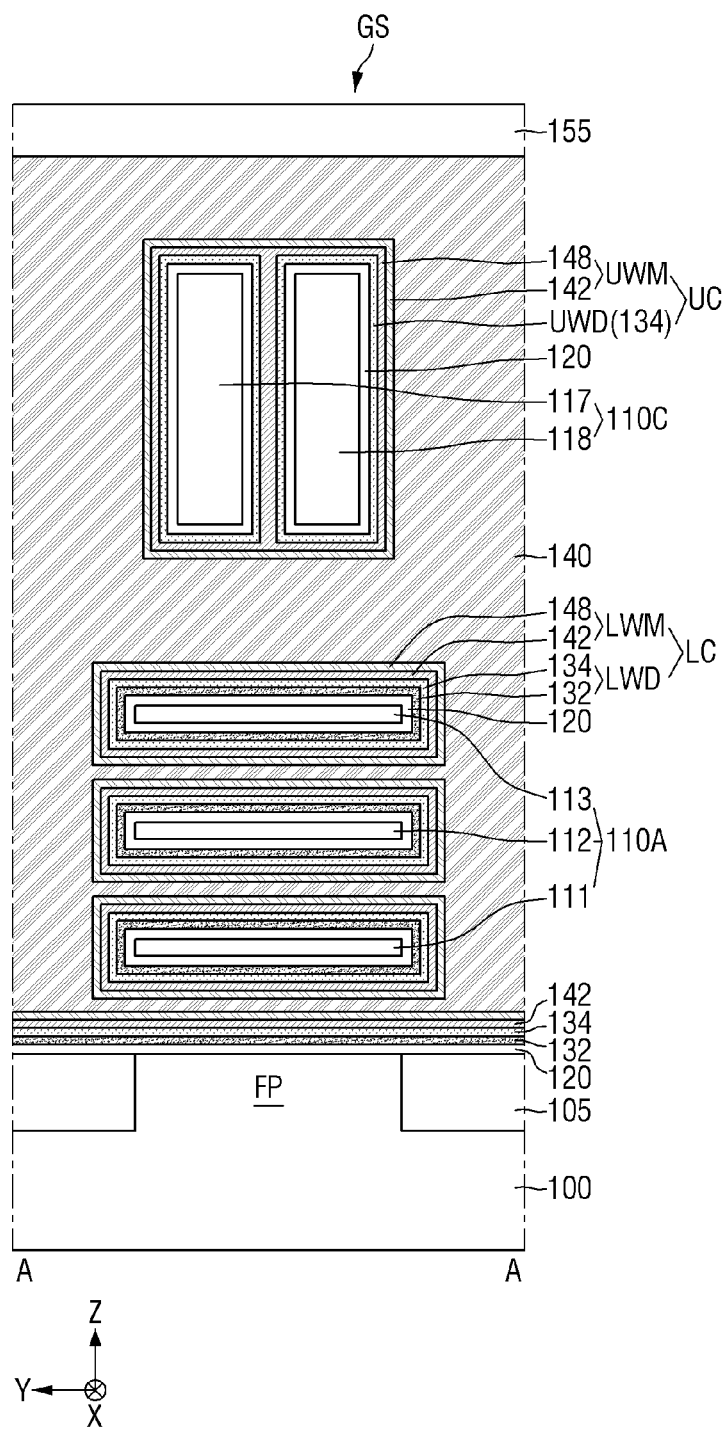
FIG. 18 is a cross-sectional view taken along a line E-E of FIG. 17.

FIG. 17 is an example layout diagram for illustrating a semiconductor device according to some embodiments. FIG. 18 is a cross-sectional view taken along a line E-E of FIG. 17. For convenience of description, the same components and configurations as those described based on FIG. 1 to FIG. 16 are briefly described or omitted.

Referring to FIG. 17 and FIG. 18, a semiconductor device according to some embodiments includes the first active pattern 110A and a third active pattern 110C.

The third active pattern 110C may be spaced apart from the first active pattern 110A and may be disposed above the first active pattern 110A. That is, the third active pattern 110C may be spaced apart from the substrate 100 by a larger spacing than a spacing by which the first active pattern 110A may be spaced apart from the substrate 100. Each of the first active pattern 110A and the third active pattern 110C may extend in the first direction X parallel to the top face of the substrate 100. The first active pattern 110A and the third active pattern 110C may overlap with each other in the third direction Z.

In some embodiments, the third active pattern 110C may include a plurality of fin patterns (e.g., second and third fin patterns 117 and 118) that are spaced apart from each other and disposed above the first active pattern 110A. The second and third fin patterns 117 and 118 may be spaced apart from the substrate 100 by a larger spacing than a spacing by which the first to third nanosheet patterns 111, 112, and 113 may be spaced apart from the substrate 100. The second and third fin patterns 117 and 118 may be spaced apart from each other in the second direction Y.

The gate dielectric film 120 may be deposited on the first active pattern 110A and the third active pattern 110C. That is, the gate dielectric film 120 may surround each of the first active pattern 110A and the third active pattern 110C. The second work function adjusting film UC may be deposited on the third active pattern 110C. That is, the second work function adjusting film UC may surround the gate dielectric film 120 on the third active pattern 110C.

FIG. 17 and FIG. 18 show that the first active pattern 110A includes the nanosheet pattern and the third active pattern 110C includes only the fin pattern. However, this is only an example. In another example, the first active pattern 110A may include a fin pattern and the third active pattern 110C may include the nanosheet pattern. In still another example, both the first active pattern 110A and the third active pattern 110C may include a fin pattern.

Following Tables 1 to 5 illustrate various combinations of the first work function adjusting film LC and the second work function adjusting film UC. However, these are merely by way of example. Those skilled in the art to which the present disclosure pertains will understand that various other combinations of the first work function adjusting film LC and the second work function adjusting film UC may be realized.

In the following Tables 1 to 5, LWD, LWM, UWD, and UWM may correspond to the first work function insulating film LWD, the first work function conductive film LWM, the second work function insulating film UWD, and the second work function conductive film UWM as described above with reference to FIG. 1 to FIG. 18, respectively. As a position of each of LWD and LWM in each of Tables 1 to 5 is closer to a top of each Table, each of LWD and LWM denotes a material film that is further away from the first active pattern 110A. As a position of each of UWD and UWM in each of Tables 1 to 5 is closer to a top of each Table, each of UWD and UWM denotes a material film that is further away from the second active pattern 110B (or the third active pattern 110C). That is, layers or elements listed closer to the top of the table may be positioned further from their respective active patterns.

In the following Tables 1 to 5, a thickness t1 of TiN is greater than a thickness t2 of TiN. In the Tables 1 to 5, TiAlC1 and TiAlC2 have different material compositions.

Tables 1 to 3 show a case in which the first active pattern 110A acts as a channel area of PFET, and the second active pattern 110B (or the third active pattern 110C) acts as a channel area of NFET.

TABLE 1

| UWM | TiAlC1 TiN(t2) | TiAlC1 TiN(t2) | TiAlC1 TiN(t2) | TiAlC2 TiN(t1) | TiAlC2 TiN(t1) | TiAlC2 TiN(t1) | TiAlC2 TiN(t1) | TiAlC2 TiN(t1) |
|---|---|---|---|---|---|---|---|---|
| UWD |  |  | LaO |  |  | LaO | LaO | AlO |
| LWM | TiAlC2 TiN(t1) | TiAlC2 TiN(t1) | TiAlC2 TiN(t1) TiAlC1 TiN(t2) | TiAlC2 TiN(t1) TiAlC1 TiN(t2) | TiAlC2 TiN(t1) TiAlC1 TiN(t2) | TiAlC2 TiN(t1) TiAlC1 TiN(t2) | TiAlC2 TiN(t1) TiAlC1 TiN(t2) | TiAlC2 TiN(t1) TiAlC1 TiN(t2) |
| LWD | AlO | LaO | LaO AlO | AlO | LaO | LaO AlO | LaO | AlO |

TABLE 2

| UWM | TiAlC1 TiN(t2) | TiAlC1 TiN(t2) | TiAlC1 TiN(t2) |
|---|---|---|---|
| UWD |  | LaO | LaO |
| LWM | TiAlC1 TiN(t2) TiN(t1) | TiAlC1 TiN(t2) TiN(t1) | TiAlC1 TiN(t2) TiN(t1) |
| LWD | LaO | LaO | AlO |

TABLE 3

| UWM | TiAlC1 TiN(t2) | TiAlC1 TiN(t2) | TiAlC1 TiN(t2) | TiAlC1 TiN(t2) | TiAlC1 TiN(t2) |
|---|---|---|---|---|---|
| UWD | AlO | AlO | LaO | AlO | LaO |
| LWM | TiAlC1 TiN(t2) | TiAlC1 TiN(t2) | TiAlC1 TiN(t2) | TiAlC1 TiN(t2) | TiAlC1 TiN(t2) |
| LWD | AlO | AlO | LaO | AlO | LaO |
| LWM | TiN(t1) | TiN(t1) | TiN(t1) | TiN(t1) | TiN(t1) |
| LWD | LaO |  |  | AlO | AlO |

Tables 4 and 5 show a case in which the first active pattern 110A acts as a channel area of NFET, and the second active pattern 110B (or the third active pattern 110C) acts as a channel area of PFET.

TABLE 4

| UWM | TiAlC2 TiN(t1) | TiAlC2 TiN(t1) | TiAlC2 TiN(t1) | TiAlC2 TiN(t1) | TiAlC2 TiN(t1) | TiAlC2 TiN(t1) | TiAlC2 TiN(t1) | TiAlC2 TiN(t1) |

TABLE 4-continued

| UWD | LaO | | LaO | LaO | LaO | LaO | LaO | |
| | LaO | | | | | LaO | LaO | |
| LWM | TiAlC2 | TiAlC2 | TiAlC2 | TiAlC2 | TiAlC2 | TiAlC2 | TiAlC2 | TiAlC2 |
| | TiN(t1) | TiN(t1) | TiN(t1) | TiN(t1) | TiN(t1) | TiN(t1) | TiN(t1) | TiN(t1) |
| | TiAlC1 | TiAlC1 | TiAlC1 | TiAlC1 | TiAlC1 | TiAlC1 | TiAlC1 | TiAlC1 |
| | TiN(t2) | TiN(t2) | TiN(t2) | TiN(t2) | TiN(t2) | TiN(t2) | TiN(t2) | TiN(t2) |
| LWD | LaO | LaO | LaO | LaO | LaO | LaO | LaO | AlO |
| | LaO | AlO | | | LaO | LaO | LaO | |
| | AlO | | | | AlO | AlO | | |
| | | | | | | AlO | | |

TABLE 5

| UWM | TiAlC2 | TiAlC2 | TiAlC2 | TiAlC2 | TiAlC2 | TiAlC2 |
| | TiN | TiN | TiON | TiON | TiN | TiN |
| | | | | | TiON | TiON |
| UWD | | | | | | |
| LWM | TiAlC1 | TiAlC1 | TiAlC1 | TiAlC1 | TiAlC1 | TiAlC1 |
| | TiN | TiN | TiN | TiN | TiN | TiN |
| LWD | AlO | LaO | AlO | LaO | AlO | LaO |

Hereinafter, a method for manufacturing a semiconductor device according to example embodiments will be described with reference to FIG. 1 to FIG. 32.

FIG. 19 to FIG. 25 are diagrams of intermediate steps for illustrating a method for manufacturing a semiconductor device according to some embodiments. For convenience of description, the same components and configurations as those described based on FIG. 1 to FIG. 18 are briefly described or omitted.

Figure 19:
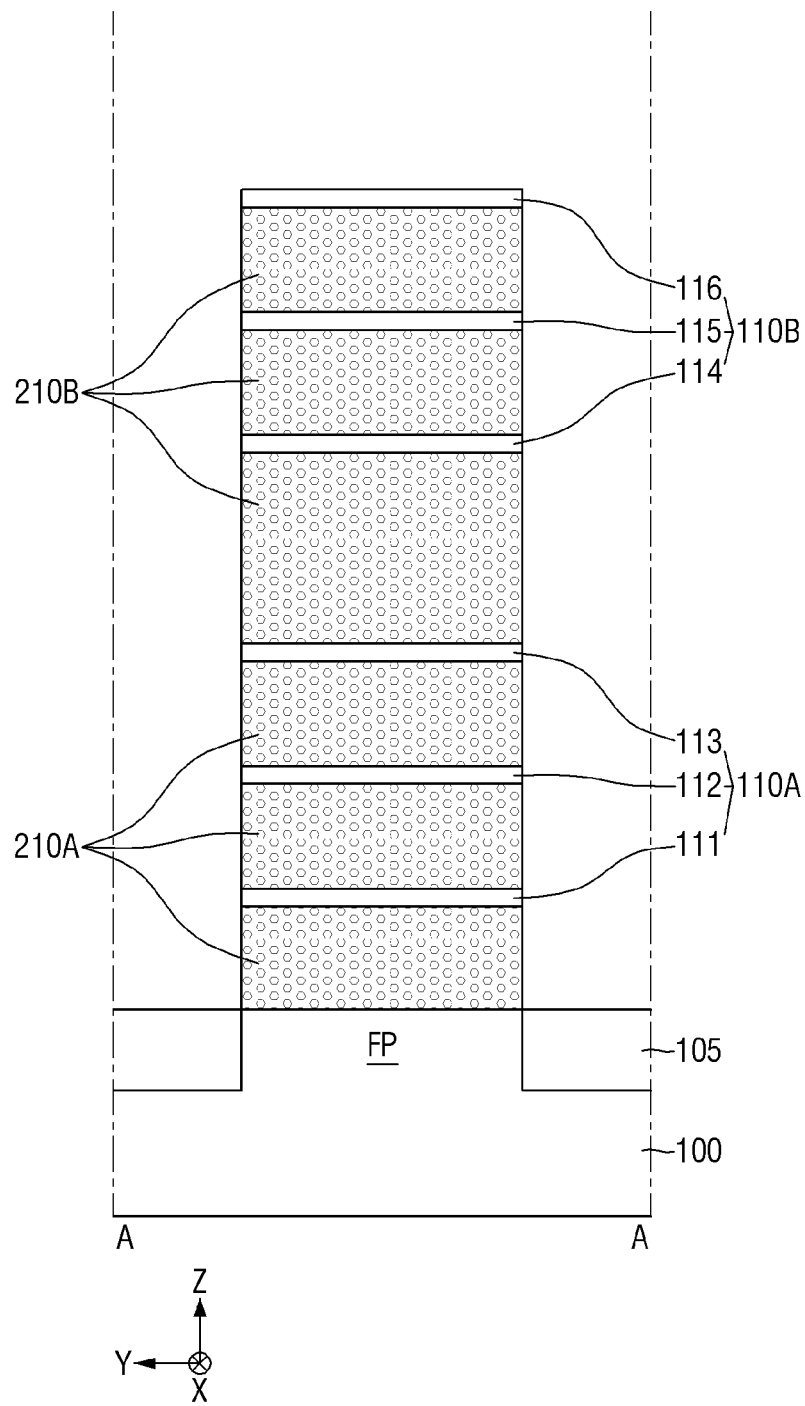
FIGS. 19, 20, 21, 22, 23, 24, and 25 are diagrams of intermediate steps for illustrating a method for manufacturing a semiconductor device according to some embodiments.

Referring to FIG. 19, a first sacrificial pattern 210A, the first active pattern 110A, a second sacrificial pattern 210B and the second active pattern 110B are formed on the substrate 100.

The first sacrificial pattern 210A and the first active pattern 110A may be alternately and vertically arranged with each other along the third direction Z and on the substrate 100. The second sacrificial pattern 210B and the second active pattern 110B may be alternately and vertically arranged with each other along the third direction Z and on the first sacrificial pattern 210A and the first active pattern 110A.

The first sacrificial pattern 210A may include a material having an etching selectivity with respect to the first active pattern 110A. The second sacrificial pattern 210B may include a material having an etch selectivity with respect to the second active pattern 110B. In one example, each of the first active pattern 110A and the second active pattern 110B may include silicon (Si), while each of the first sacrificial pattern 210A and the second sacrificial pattern 210B may include silicon germanium (SiGe). The first sacrificial pattern 210A and the second sacrificial pattern 210B may include the same material as each other, or may include different materials from each other.

Figure 20:
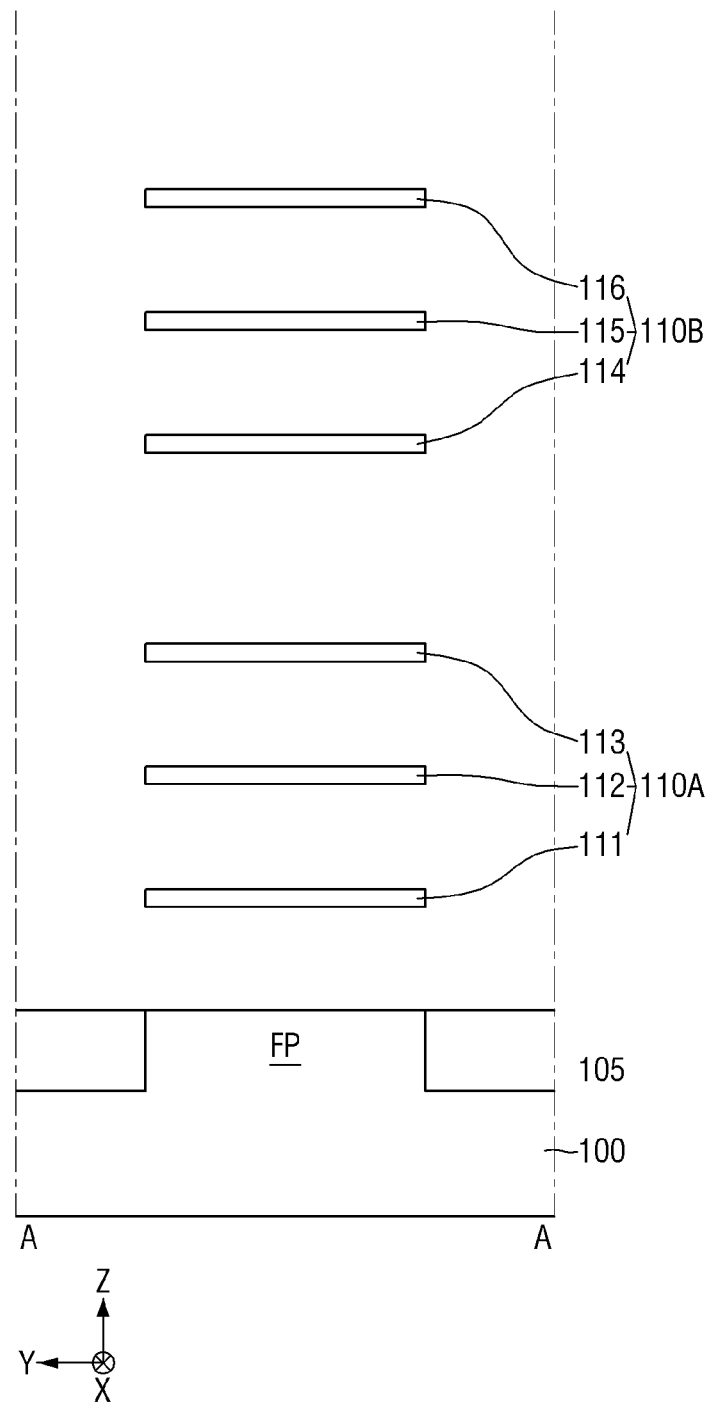

Referring to FIG. 20, the first sacrificial pattern 210A and the second sacrificial pattern 210B are removed.

For example, an etching process for removing the first sacrificial pattern 210A and the second sacrificial pattern 210B may be performed. The etching process may include, but may not be limited to, for example, a wet etching process. Because each of the first sacrificial pattern 210A and the second sacrificial pattern 210B may have the etch selectivity with respect to each of the first active pattern 110A and the second active pattern 110B, each of the first sacrificial pattern 210A and the second sacrificial pattern 210B may be selectively removed.

Figure 21:
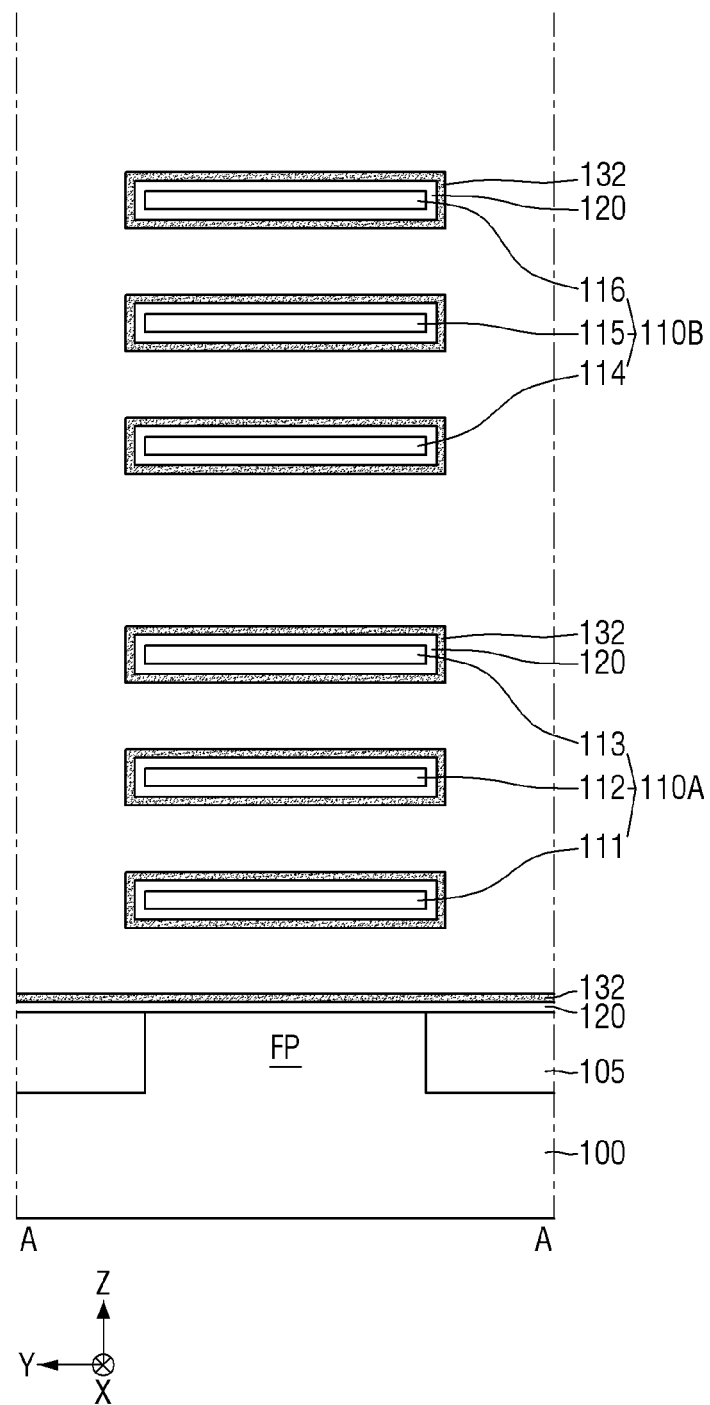

Referring to FIG. 21, the gate dielectric film 120 and the first metal oxide film 132 are sequentially formed.

The gate dielectric film 120 may be deposited on each of the first active pattern 110A and the second active pattern 110B. The first metal oxide film 132 may be deposited on the gate dielectric film 120. Each of the gate dielectric film 120 and the first metal oxide film 132 may be deposited on the substrate 100 and the field insulating film 105.

In some embodiments, after the first metal oxide film 132 has been formed, a first annealing process may be performed on the first metal oxide film 132. The first annealing process may include, for example, a heat treatment process. The present disclosure is not limited thereto. The first annealing process may allow properties of the first metal oxide film 132 to be enhanced.

The gate dielectric film 120 may include, for example, at least one of silicon oxide, silicon oxynitride, silicon nitride, or a high-k material having a higher dielectric constant than that of silicon oxide. The present disclosure is not limited thereto.

The first metal oxide film 132 may include an insulating film capable of controlling a work function, for example, a film made of at least one of AlO, LaO, and a combination thereof.

Figure 22:
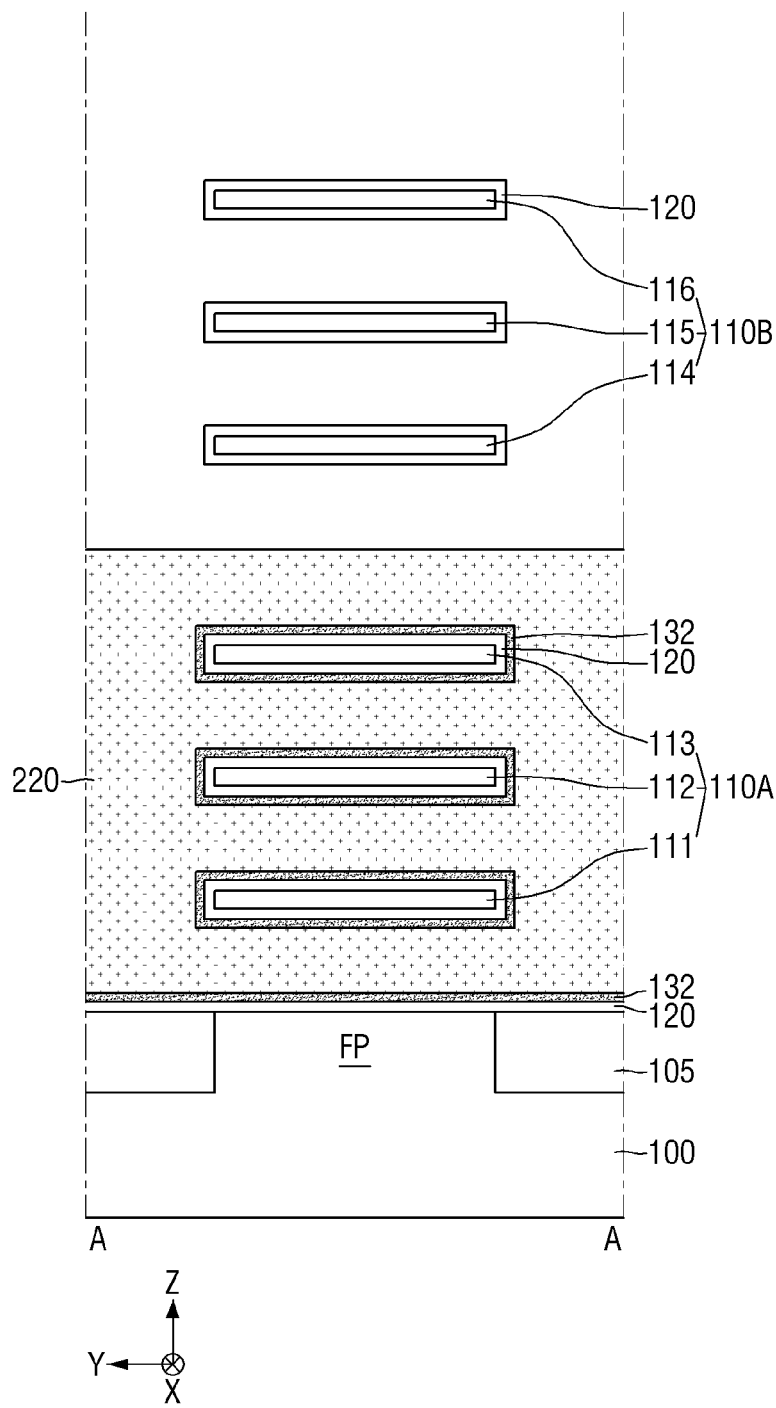

Referring to FIG. 21 and FIG. 22, the first metal oxide film 132 on the second active pattern 110B is removed.

Specifically, a first protective pattern 220 covering the first metal oxide film 132 on the first active pattern 110A may be formed. A vertical level of a top face of the first protection pattern 220 may be lower than that of a bottom surface of the second active pattern 110B. Thus, the first metal oxide film 132 on the second active pattern 110B may be exposed out of or by the first protective pattern 220. Subsequently, the first metal oxide film 132 exposed out of or by the first protective pattern 220 may be removed. After the first metal oxide film 132 on the second active pattern 110B has been removed, the first protective pattern 220 may be removed.

Figure 23:
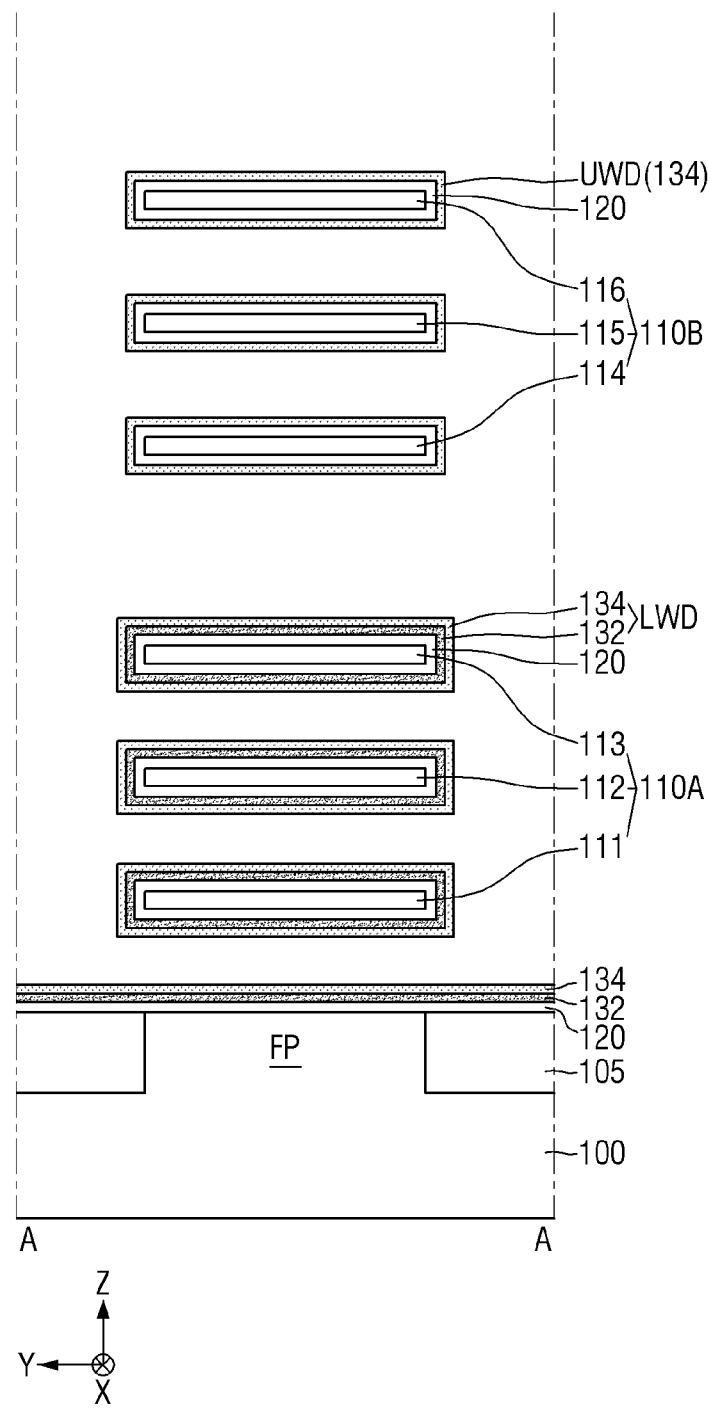

Referring to FIG. 23, the second metal oxide film 134 is formed.

The second metal oxide film 134 may be deposited on the first metal oxide film 132 on the first active pattern 110A. The second metal oxide film 134 may be deposited on each of the substrate 100 and the field insulating film 105. Thus, the first work function insulating film LWD including the first metal oxide film 132 and the second metal oxide film 134 may be formed.

Further, the second metal oxide film 134 may be deposited on the gate dielectric film 120 on the second active pattern 110B. Thus, the second work function insulating film UWD including the second metal oxide film 134 may be formed. As described above with reference to FIG. 22, the first metal oxide film 132 on the second active pattern 110B may be removed. Thus, the number of metal oxide films of the second work function insulating film UWD may be smaller than the number of metal oxide films of the first work function insulating film LWD.

In some embodiments, after the second metal oxide film 134 has been formed, a second annealing process may be performed on the second metal oxide film 134. The second annealing process may include, for example, a heat treatment process. The present disclosure is not limited thereto. The second annealing process may allow properties of the second metal oxide film 134 to be enhanced.

The second metal oxide film 134 may include an insulating film capable of controlling a work function, for example, a film made of at least one of AlO, LaO, and a combination thereof. The first metal oxide film 132 and the second metal oxide film 134 may include different materials. In one example, the first metal oxide film 132 may include AlO, while the second metal oxide film 134 may include LaO.

Figure 24:
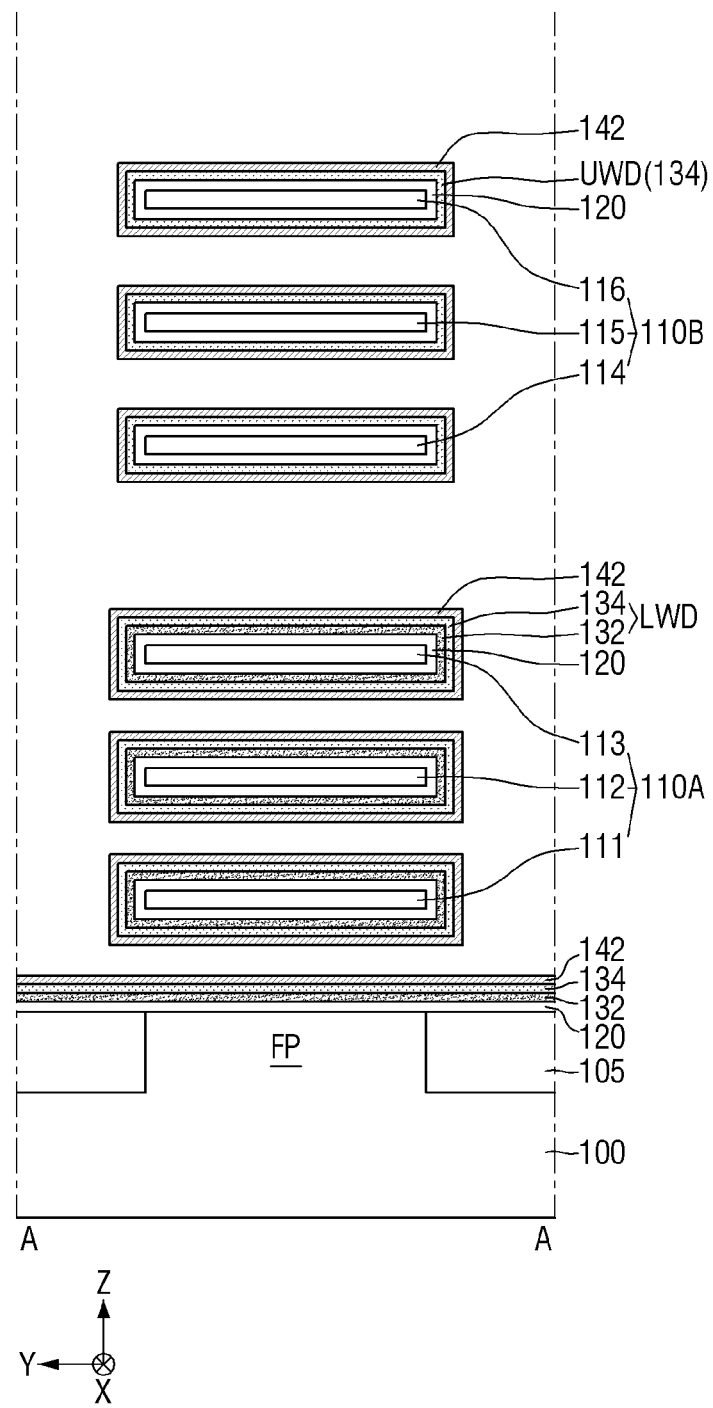

Referring to FIG. 24, the first metal film 142 is formed.

The first metal film 142 may be deposited on each of the first work function insulating film LWD and the second work function insulating film UWD. The first metal film 142 may include a conductive film capable of controlling a work function, for example, a film made of at least one of TiN, TaN, TiC, TaC, TiAlC, TiON, and combinations thereof.

Figure 25:
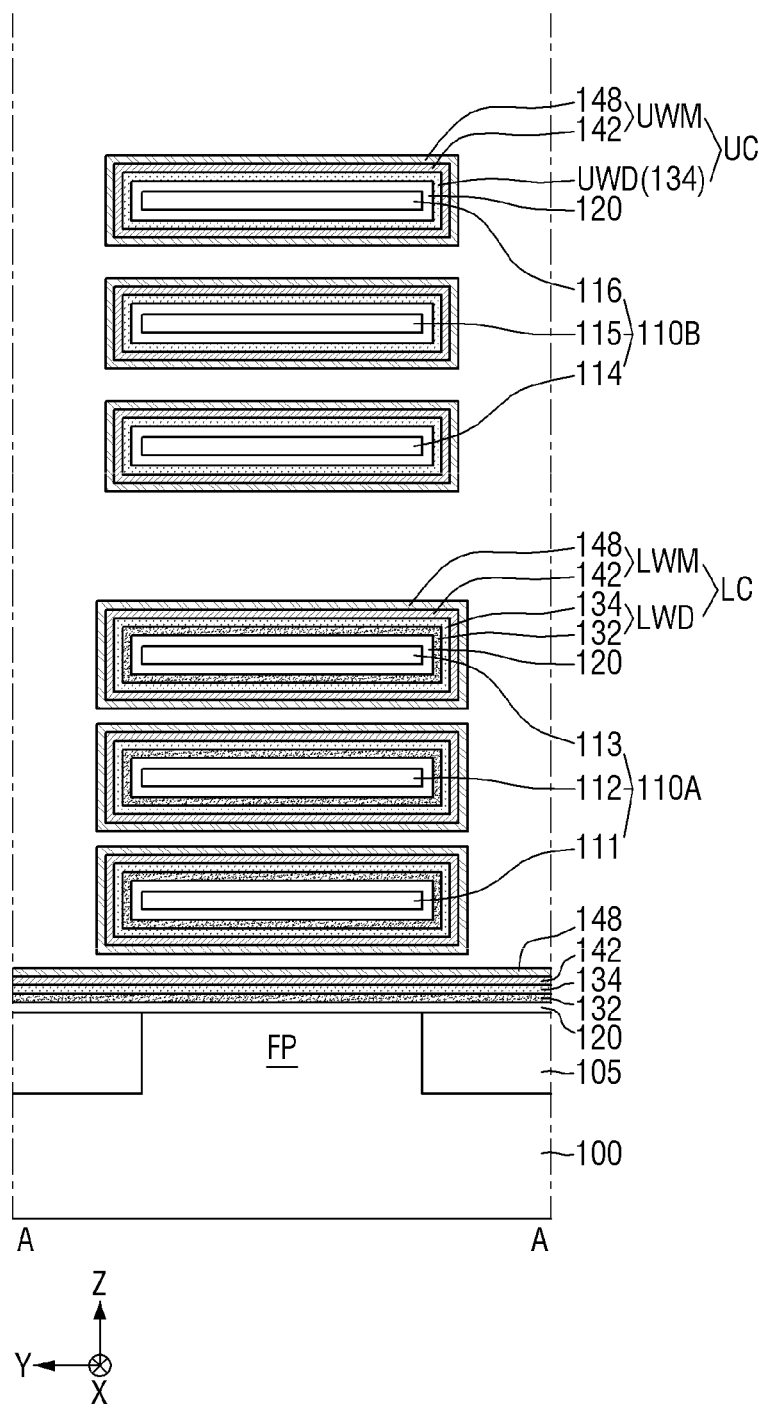

Referring to FIG. 25, the second metal film 148 is formed.

The second metal film 148 may be deposited on the first metal film 142 on the first work function insulating film LWD. Thus, the first work function conductive film LWM including the first metal film 142 and the second metal film 148 may be formed, and the first work function adjusting film LC including the first work function insulating film LWD and the first work function conductive film LWM may be formed.

Further, the second metal film 148 may be deposited on the first metal film 142 on the second work function insulating film UWD. Thus, the second work function conductive film UWM including the first metal film 142 and the second metal film 148 may be formed, and the second work function adjusting film UC including the second work function insulating film UWD and the second work function conductive film UWM may be formed.

The second metal film 148 may include a conductive film capable of controlling a work function, for example, a film made of at least one of TiN, TaN, TiC, TaC, TiAlC, TiON, and combinations thereof. The first metal film 142 and the second metal film 148 may include different materials. In one example, the first metal film 142 may include TiN, while the second metal film 148 may include TiAlC.

Then, referring to FIG. 2A, a filling conductive film 140 is formed.

The filling conductive film 140 may be deposited on each of the first work function adjusting film LC and the second work function adjusting film UC. The filling conductive film 140 may fill a space defined by each of the first work function adjusting film LC and the second work function adjusting film UC. The filling conductive film 140 may include, for example, at least one of tungsten (W), aluminum (Al), and a combination thereof. The present disclosure is not limited thereto.

Thus, a semiconductor device including the gate structure GS as described above with reference to FIG. 2A may be manufactured.

Figure 26:
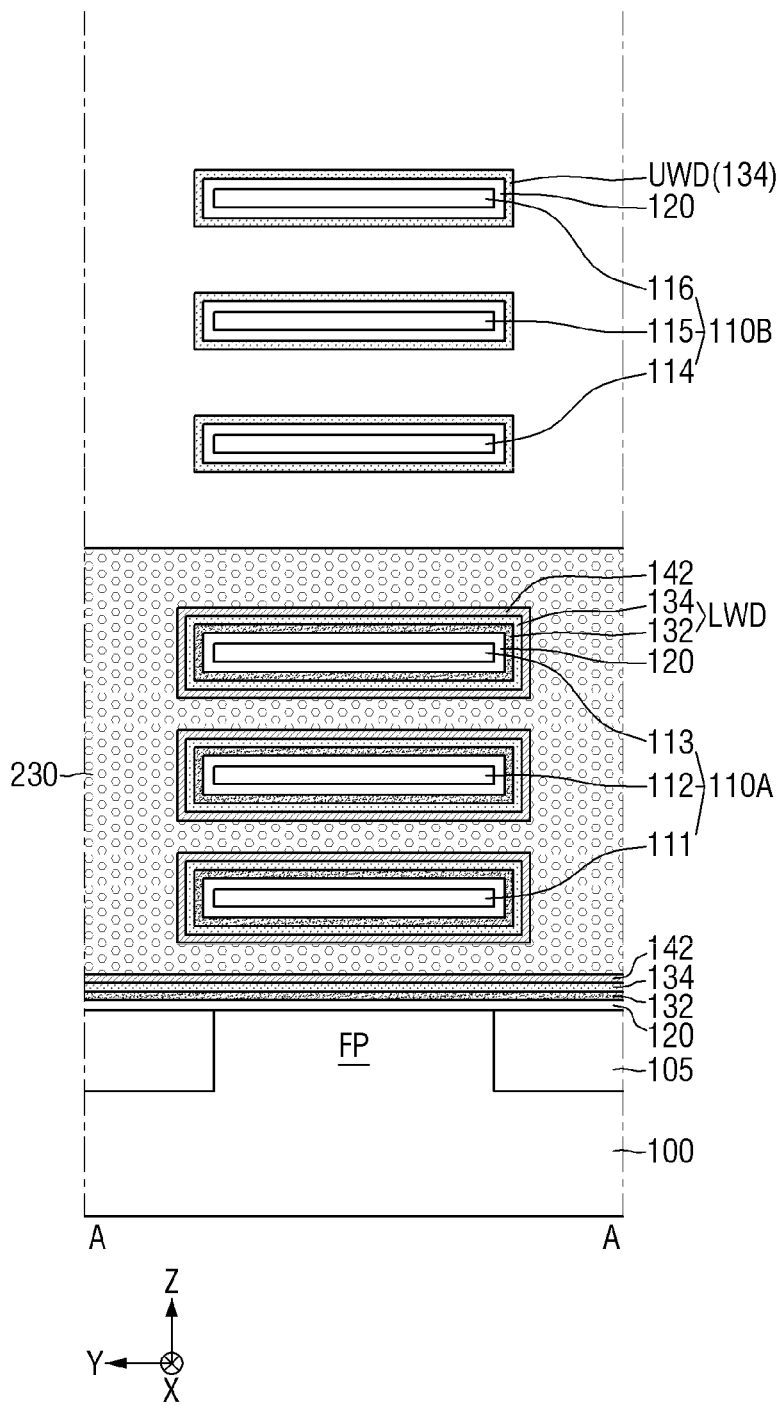
FIG. 26 and FIG. 27 are diagrams of intermediate steps for illustrating a method for manufacturing a semiconductor device according to some embodiments.
Figure 27:
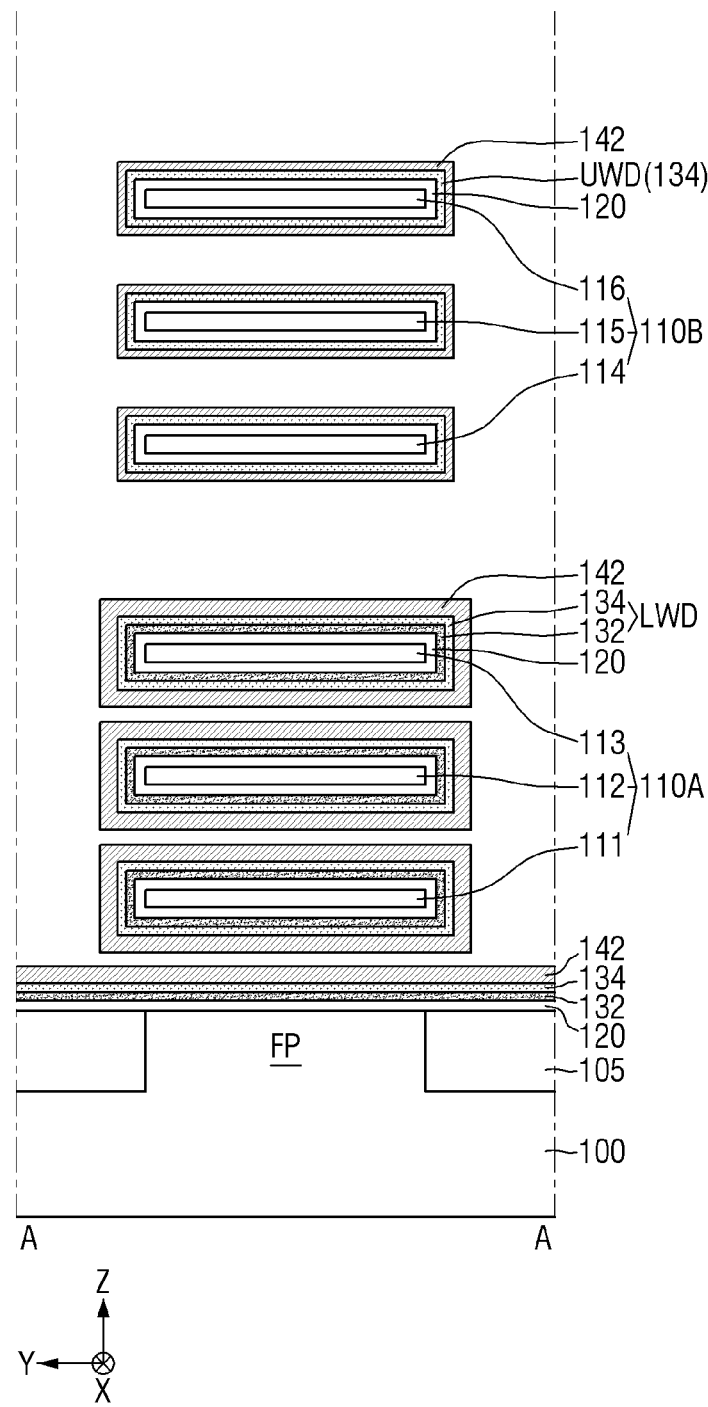

FIG. 26 and FIG. 27 are diagrams of intermediate steps for illustrating a method for manufacturing a semiconductor device according to some embodiments. For convenience of description, the same components and configurations as those described based on FIG. 1 to FIG. 25 are briefly described or omitted. For reference, FIG. 26 is a diagram of an intermediate step for illustrating a step after FIG. 24.

Referring to FIG. 26, the first metal film 142 on the second active pattern 110B is removed.

Specifically, a second protective pattern 230 covering the first metal film 142 on the first active pattern 110A may be formed. A vertical level of a top face of the second protection pattern 230 may be lower than the bottom surface of the second active pattern 110B. Thus, the first metal film 142 on the second active pattern 110B may be exposed out of or by the second protective pattern 230. Subsequently, the first metal film 142 exposed out of or by the second protective pattern 230 may be removed. After the first metal film 142 on the second active pattern 110B has been removed, the second protective pattern 230 may be removed.

Referring to FIG. 26 and FIG. 27, the first metal film 142 is re-formed.

The re-formed first metal film 142 may be deposited on the first metal film 142 on the first active pattern 110A. Further, the re-formed first metal film 142 may be deposited on the second work function insulating film UWD. Thus, a thickness (e.g., t1 in FIG. 2B) of the first metal film 142 on the first active pattern 110A may be greater than a thickness (e.g., t2 in FIG. 2B) of the first metal film 142 on the second active pattern 110B.

Then, the step described above with reference to FIG. 25 may be performed. Thus, a semiconductor device including the gate structure GS as described above with reference to FIG. 6A may be manufactured.

Figure 28:
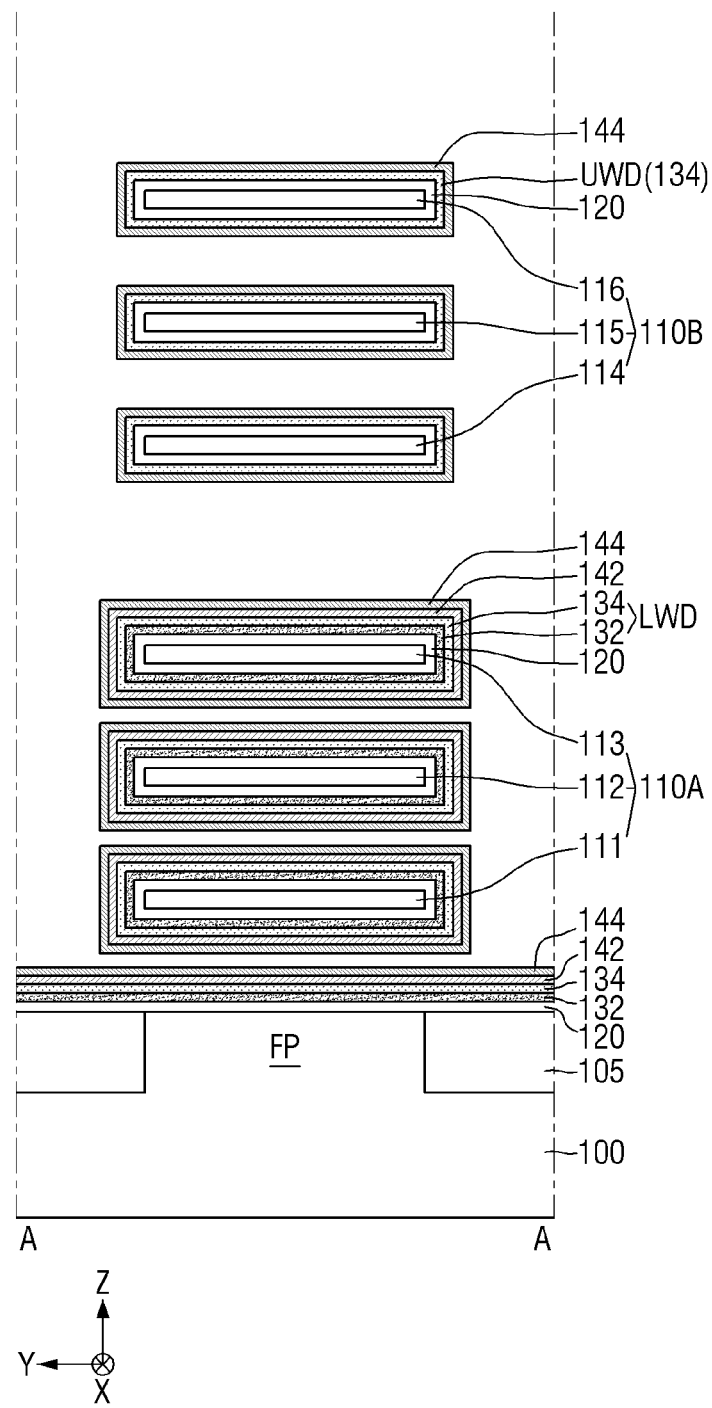
FIG. 28 is a diagram of an intermediate step for illustrating a method for manufacturing a semiconductor device according to some embodiments.

FIG. 28 is a diagram of an intermediate step for illustrating a method for manufacturing a semiconductor device according to some embodiments. For convenience of description, the same components and configurations as those described based on FIG. 1 to FIG. 17 are briefly described or omitted. For reference, FIG. 28 is a diagram of an intermediate step for illustrating a step after FIG. 26.

Referring to FIG. 26 and FIG. 28, the third metal film 144 is formed.

The third metal film 144 may be deposited on the first metal film 142 on the first active pattern 110A. Further, the third metal film 144 may be deposited on the second work function insulating film UWD.

Then, the step as described above with reference to FIG. 25 may be performed. Thus, a semiconductor device including the gate structure GS as described above with reference to FIG. 7A may be manufactured.

As described above with reference to FIG. 26, the first metal film 142 on the second active pattern 110B may be removed, such that the number of metal films of the second work function conductive film UWM may be smaller than the number of metal films of the first work function conductive film LWM.

Figure 29:
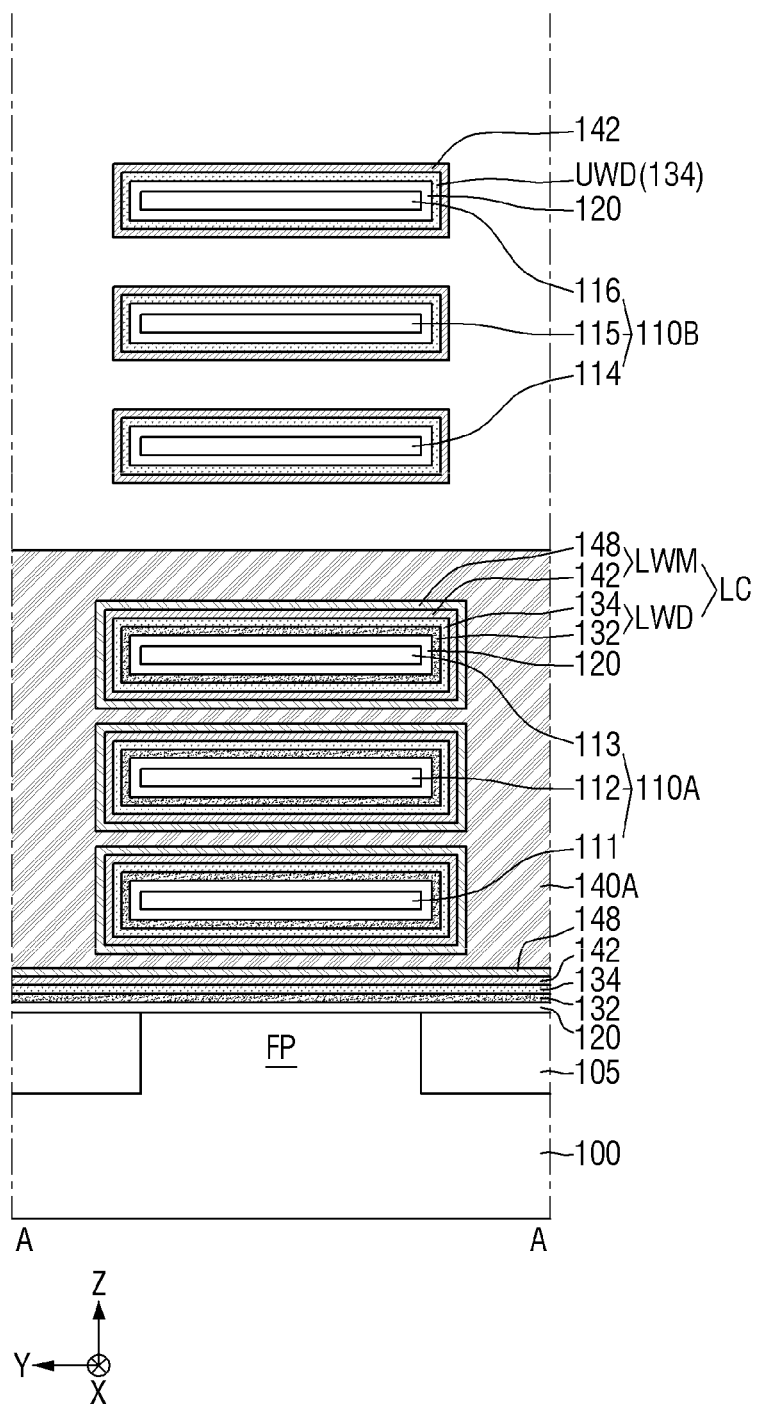
FIG. 29 is a diagram of an intermediate step for illustrating a method for manufacturing a semiconductor device according to some embodiments.

FIG. 29 is a diagram of an intermediate step for illustrating a method for manufacturing a semiconductor device according to some embodiments. For convenience of description, the same components and configurations as those described based on FIG. 1 to FIG. 28 are briefly described or omitted. For reference, FIG. 29 is a diagram of an intermediate step for illustrating a step after FIG. 25.

Referring to FIG. 25 and FIG. 29, the first filling conductive film 140A is formed.

Specifically, the filling conductive film deposited on each of the first work function adjusting film LC and the second work function adjusting film UC may be formed. Subsequently, a recess process into the filling conductive film may be performed. Thus, the first filling conductive film 140A covering the first work function adjusting film LC may be formed. A vertical level of a top face of the first filling conductive film 140A may be lower than that of a bottom face of the second active pattern 110B. Thus, the second metal film 148 on the second active pattern 110B may be exposed out of or by the first filling conductive film 140A. Subsequently, the second metal film 148 exposed out of or by the first filling conductive film 140A may be removed.

Then, referring to FIG. 13, the fifth metal film 149 and the second filling conductive film 140B are formed.

The fifth metal film 149 may be deposited on the second work function insulating film UWD. The fifth metal film 149 may be deposited on the first filling conductive film 140A. Thus, the second work function conductive film UWM including the first metal film 142 and the fifth metal film 149 may be formed. The second filling conductive film 140B may be deposited on the second work function conductive film UWM.

Thus, a semiconductor device including the gate structure GS as described above with reference to FIG. 13 may be manufactured.

Figure 30:
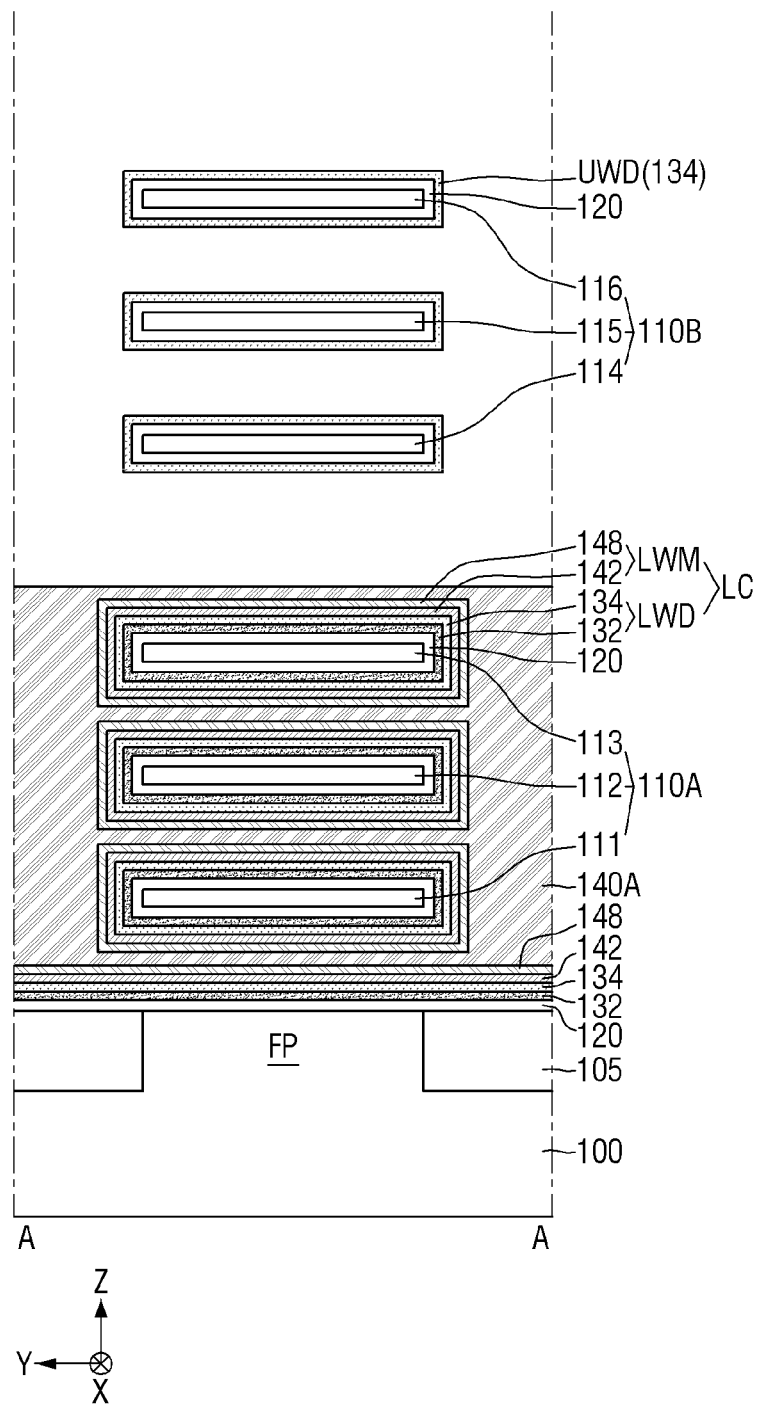
FIG. 30 and FIG. 31 are diagrams of intermediate steps for illustrating a method for manufacturing a semiconductor device according to some embodiments.
Figure 31:
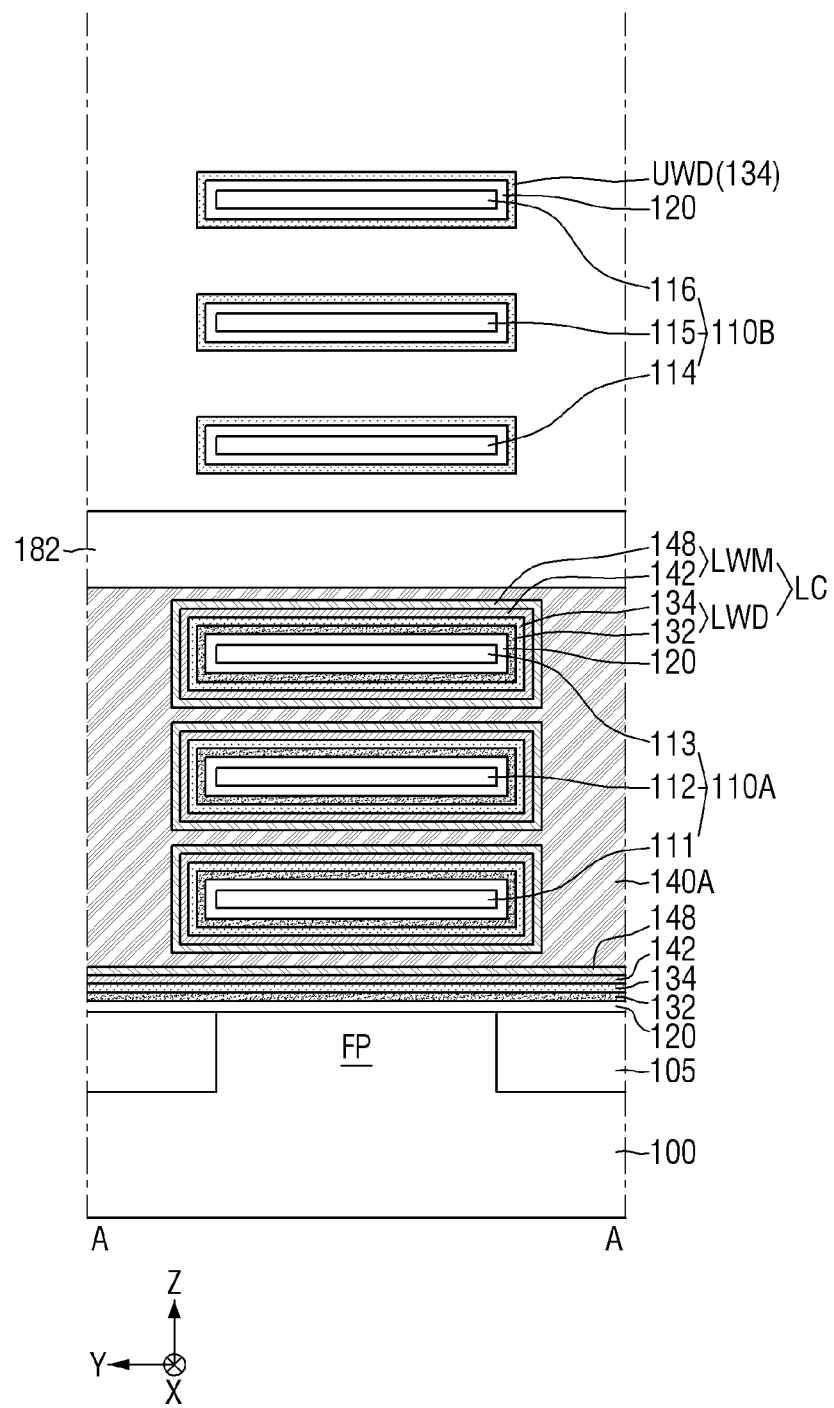

FIG. 30 and FIG. 31 are diagrams of intermediate steps for illustrating a method for manufacturing a semiconductor device according to some embodiments. For convenience of description, the same components and configurations as those described based on FIG. 1 to FIG. 29 are briefly described or omitted. For reference, FIG. 30 is a diagram of an intermediate step for illustrating a step after FIG. 25.

Referring to FIG. 25 and FIG. 30, the first filling conductive film 140A is formed.

Because the formation of the first filling conductive film 140A is similar to that as described above with reference to FIG. 29, detailed description thereof will be omitted below.

In some embodiments, the first metal film 142 on the second active pattern 110B may be removed. For example, the first metal film 142 on the second active pattern 110B may be removed using a recess process to form the first filling conductive film 140A. However, this is only an example. It should be appreciated that the first metal film 142 on the second active pattern 110B may not be removed.

Referring to FIG. 31, the second separating insulating film 182 is formed.

The second separating insulating film 182 may be formed on the first filling conductive film 140A. For example, the second separating insulating film 182 may cover a top face of the first filling conductive film 140A.

Subsequently, referring to FIG. 14, the first metal film 142, the fifth metal film 149, and the second filling conductive film 140B are formed.

The first metal film 142, the fifth metal film 149, and the second filling conductive film 140B may be deposited on the second work function insulating film UWD. Thus, the second work function conductive film UWM including the first metal film 142 and the fifth metal film 149 may be formed. The second filling conductive film 140B may be deposited on the second work function conductive film UWM.

Thus, a semiconductor device including the gate structure GS as described above with reference to FIG. 14 may be manufactured.

Figure 32:
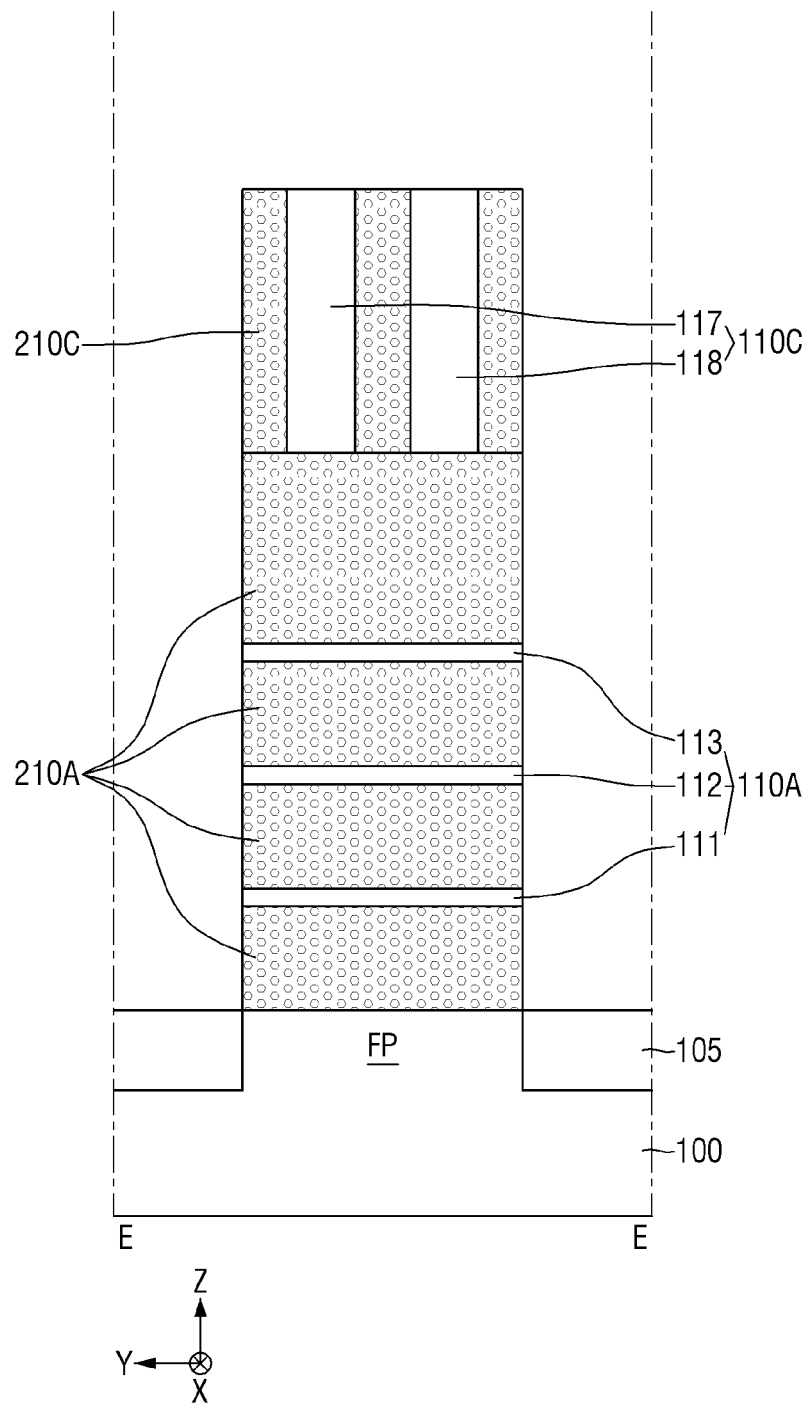
FIG. 32 is a diagram of an intermediate step for illustrating a method for manufacturing a semiconductor device according to some embodiments.

FIG. 32 is a diagram of an intermediate step for illustrating a method for manufacturing a semiconductor device according to some embodiments. For convenience of description, the same components and configurations as those described based on FIG. 1 to FIG. 25 are briefly described or omitted.

Referring to FIG. 32, the first sacrificial pattern 210A, the first active pattern 110A, a third sacrificial pattern 210C and the third active pattern 110C are formed on the substrate 100.

The first sacrificial pattern 210A and the first active pattern 110A may be alternately and vertically arranged with each other along the third direction Z and on the substrate 100. The third sacrificial pattern 210C and the third active pattern 110C may be alternately and horizontally arranged with each other along the second direction Y and on the substrate 100.

The third sacrificial pattern 210C may include a material having an etch selectivity with respect to the third active pattern 110C. In one example, the third active pattern 110C may include silicon (Si), while the third sacrificial pattern 210C may include silicon germanium (SiGe). The first sacrificial pattern 210A and the third sacrificial pattern 210C may include the same material as each other or may include different materials from each other.

Then, the steps as described above with reference to FIG. 20 to FIG. 25 may be performed. Thus, a semiconductor device including the gate structure GS as described above with reference to FIG. 18 may be manufactured.

In the method for manufacturing the semiconductor device according to some embodiments, the metal film (e.g., the first work function conductive film LWM and the second work function conductive film UWM) may be formed after the metal oxide film (e.g., the first work function insulating film LWD and the second work function insulating film UWD) has been formed. Thus, deterioration of the metal film due to the annealing process may be reduced or prevented. Specifically, as described above, the first work function conductive film LWM and the second work function conductive film UWM may be formed respectively after the first annealing process on the first work function insulating film LWD and the second annealing process on the second work function insulating film UWD have been completed. Thus, deterioration of properties of the first work function conductive film LWM and the second work function conductive film UWM may be suppressed, thereby realizing the method for manufacturing the semiconductor device having improved performance.

In concluding the detailed description, those skilled in the art will appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:
1. A semiconductor device comprising:
a substrate;
a first active pattern on the substrate and extending in a first direction;
a second active pattern stacked on the first active pattern and extending in the first direction and spaced apart from the substrate by a larger spacing than that by which the first active pattern is spaced apart from the substrate;
a gate electrode on the substrate, extending in a second direction intersecting the first direction, and surrounding the first active pattern and the second active pattern; and
a high dielectric film between the first active pattern and the gate electrode and between the second active pattern and the gate electrode, wherein the gate electrode comprises:
- a first work function adjusting film on the high dielectric film, and surrounding the first active pattern;
- a second work function adjusting film on the high dielectric film and surrounding the second active pattern and spaced apart from the first work function adjusting film; and
- a filling conductive film surrounding the first work function adjusting film and the second work function adjusting film, wherein the first work function adjusting film comprises:
- a first work function insulating film comprising a plurality of metal oxide films comprising a first metal oxide film and a second metal oxide film different from the first metal oxide film; and
- a first work function conductive film comprising a plurality of metal films comprising a first metal films, wherein the second work function adjusting film comprises:
- a second work function insulating film comprising at least one metal oxide film comprising the first metal oxide film; and
- a second work function conductive film comprising a plurality of metal films comprising the first metal film, wherein a number of films included in the first work function adjusting film is greater than a number of films included in the second work function adjusting film, wherein a number of films included in the first work function conductive film is greater than or equal to a number of films included in the second work function conductive film.

2. The semiconductor device of claim 1, wherein the second work function insulating film is free of the second metal oxide film.

3. The semiconductor device of claim 2, wherein the first work function conductive film further comprises a second metal film different from the first metal film,
wherein the second work function conductive film is free of the second metal film.

4. The semiconductor device of claim 1, wherein the second work function insulating film is between the high dielectric film and the second work function conductive film.

5. The semiconductor device of claim 1, wherein the first work function insulating film is between the high dielectric film and the first work function conductive film.

6. The semiconductor device of claim 1, wherein the first work function conductive film further comprises:
- a second metal film between the first work function insulating film and the filling conductive film, and
wherein the first metal film of the first work function conductive film is between the high dielectric film and the first work function insulating film.

7. The semiconductor device of claim 6,
wherein the first metal oxide film of the first work function insulating film is between the high dielectric film and the first metal film of the first work function conductive film,
wherein the second metal oxide film of the first work function insulating film is between the first metal film of the first work function conductive film and the second metal film.

8. The semiconductor device of claim 1, wherein the first work function insulating film comprises at least one of AlO, LaO, or a combination thereof.

9. The semiconductor device of claim 1, wherein the first work function conductive film comprises at least one of TiN, TaN, TiC, TaC, TiAlC, TiON, or combinations thereof.

10. The semiconductor device of claim 1, wherein the semiconductor device further comprises:
- a first source/drain area on a sidewall of the gate electrode, and connected to the first active pattern, and having a first conductivity type; and
- a second source/drain area on the sidewall of the gate electrode, and connected to the second active pattern, and having a second conductivity type different from the first conductivity type.

11. The semiconductor device of claim 10, wherein the semiconductor device further comprises:
- a first source/drain contact extending through the second source/drain area and electrically connected to the first source/drain area;
- a contact insulating film between the first source/drain area and the first source/drain contact, and extending along a sidewall of the first source/drain contact; and
- a second source/drain contact electrically connected to the second source/drain area.

12. The semiconductor device of claim 11, wherein the semiconductor device further comprises a third source/drain contact extending through the second source/drain area and electrically connected to the first source/drain area and the second source/drain area.

13. The semiconductor device of claim 1, wherein the semiconductor device further comprises a gate spacer extending along a side of the gate electrode,
wherein the high dielectric film, the first work function adjusting film, and the second work function adjusting film are between the gate spacer and the filling conductive film.

14. The semiconductor device of claim 1, wherein the semiconductor device further comprises an interfacial film between the first active pattern and the high dielectric film, and between the second active pattern and the high dielectric film, wherein the interfacial film comprises a semiconductor oxide.

15. A semiconductor device comprising:
- a substrate;
- a first active pattern on the substrate and extending in a first direction;
- a second active pattern stacked on the first active pattern and spaced apart from the substrate by a larger spacing than that by which the first active pattern is spaced apart from the substrate, wherein the second active pattern extends in the first direction;
- a gate electrode on the substrate, extending in a second direction intersecting the first direction, and surrounding the first active pattern and the second active pattern; and
- a high dielectric film between the first active pattern and the gate electrode and between the second active pattern and the gate electrode, wherein the gate electrode comprises:
- a first work function adjusting film on the high dielectric film and surrounding the first active pattern;
- a second work function adjusting film on the high dielectric film and surrounding the second active pattern and spaced apart from the first work function adjusting film; and
- a filling conductive film surrounding the first work function adjusting film and the second work function adjusting film, wherein the first work function adjusting film comprises;
   a first work function insulating film comprising a plurality of metal oxide films comprising a first metal oxide film and a second metal oxide film different from the first metal oxide film; and
   a first work function conductive film comprising a plurality of metal films comprising a first metal film, and
wherein the second work function adjusting film comprises:
   a second work function insulating film comprising at least one metal oxide film comprising the first metal oxide film; and
   a second work function conductive film comprising a plurality of metal films comprising the first metal film,
wherein a number of films included in the first work function adjusting film is greater than a number of films included in the second work function adjusting film, and
wherein a number of films included in the first work function insulating film is greater than a number of films included in the second work function insulating film.

16. The semiconductor device of claim 15, wherein the second work function insulating film is free of the second metal oxide film.

17. The semiconductor device of claim 16, wherein the first metal oxide film of the first work function insulating film and the second metal oxide film are sequentially stacked on the high dielectric film,
wherein a work function of the first metal oxide film of the first work function insulating film is larger than a work function of the second metal oxide film.

18. The semiconductor device of claim 15, wherein a number of films included in the first work function conductive film is greater than or equal to a number of films included in the second work function conductive film.

19. A semiconductor device comprising:
   a substrate;
   a first active pattern on the substrate and extending in a first direction;
   a second active pattern stacked on the first active pattern and spaced apart from the substrate by a larger spacing than that by which the first active pattern is spaced apart from the substrate, wherein the second active pattern extends in the first direction;
   a gate electrode on the substrate, extending in a second direction intersecting the first direction, and surrounding the first active pattern and the second active pattern; and
   a high dielectric film between the first active pattern and the gate electrode and between the second active pattern and the gate electrode,
wherein the gate electrode comprises:
   a first work function adjusting film on the high dielectric film and surrounding the first active pattern;
   a second work function adjusting film on the high dielectric film and surrounding the second active pattern and spaced apart from the first work function adjusting film; and
   a filling conductive film surrounding the first work function adjusting film and the second work function adjusting film,
wherein the first work function adjusting film comprises:
   a first work function insulating film comprising a plurality of metal oxide films comprising a first metal oxide film and a second metal oxide film different from the first metal oxide film; and
   a first work function conductive film comprising a plurality of metal films comprising a first metal film,
wherein the second work function adjusting film comprises:
   a second work function insulating film comprising at least one metal oxide film comprising the first metal oxide film; and
   a second work function conductive film comprising a plurality of metal films comprising the first metal film,
wherein a number of films included in the first work function adjusting film is greater than a number of films included in the second work function adjusting film,
wherein a thickness of the first metal film of the first work function conductive film is greater than a thickness of the first metal film of the second work function conductive film.

20. The semiconductor device of claim 19, wherein the first work function insulating film comprises at least one of AlO, LaO, or a combination thereof,
wherein the first work function conductive film comprises at least one of TiN, TaN, TiC, TaC, TiAlC, TiON, or combinations thereof.

* * * * *